(12) United States Patent
Sravan et al.

(10) Patent No.: US 11,269,555 B2
(45) Date of Patent: Mar. 8, 2022

(54) SYSTEM IDLE TIME REDUCTION METHODS AND APPARATUS

(71) Applicant: SanDisk Technologies LLC, Addison, TX (US)

(72) Inventors: Harihara Sravan, Bangalore (IN); Nihal Singla, Bangalore (IN); Chinh Vo, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/907,411

(22) Filed: Jun. 22, 2020

(65) Prior Publication Data

US 2021/0397372 A1 Dec. 23, 2021

(51) Int. Cl.

| G11C 16/04 | (2006.01) |
|---|---|
| G06F 3/06 | (2006.01) |
| H01L 25/18 | (2006.01) |
| H01L 23/00 | (2006.01) |
| G11C 16/10 | (2006.01) |
| H01L 27/11582 | (2017.01) |

(52) U.S. Cl.
CPC .......... *G06F 3/0659* (2013.01); *G06F 3/0604* (2013.01); *G06F 3/0679* (2013.01); *G11C 16/0483* (2013.01); *G11C 16/10* (2013.01); *H01L 24/08* (2013.01); *H01L 25/18* (2013.01); *H01L 27/11582* (2013.01); *H01L 2224/08145* (2013.01)

(58) Field of Classification Search
CPC ... G11C 16/0483; G11C 16/10; G06F 3/0659; G06F 3/0604; G06F 3/0679
See application file for complete search history.

(56) References Cited

U.S. PATENT DOCUMENTS

| 7,266,662 B2* | 9/2007 | Kim ..................... G11C 7/1039 365/189.05 |
|---|---|---|
| 7,373,432 B2* | 5/2008 | Rapp ................... G06F 15/7867 710/8 |
| 10,524,022 B2 | 12/2019 | Rawal |
| 10,884,957 B2* | 1/2021 | Mathuriya .......... G06F 13/1668 |
| 2018/0293191 A1 | 10/2018 | Li |
| 2018/0357123 A1 | 12/2018 | Mn et al. |
| 2019/0057727 A1* | 2/2019 | Mathuriya ........... G11C 7/1003 |

FOREIGN PATENT DOCUMENTS

| CN | 104407997 | 3/2015 |
|---|---|---|
| JP | 2013143160 | 7/2013 |
| WO | 2007130976 | 11/2007 |

* cited by examiner

*Primary Examiner* — Pho M Luu
(74) *Attorney, Agent, or Firm* — Vierra Magen Marcus LLP

(57) ABSTRACT

An apparatus is provided that includes a memory die including a pipeline circuit coupled to a memory structure. The memory die is configured to execute a first command by receiving in the pipeline circuit data to be written to the memory structure, processing the received data in the pipeline circuit and providing the processed data to the memory structure, predicting that the pipeline circuit has completed processing the received data, and ending execution of the first command based on the prediction.

20 Claims, 22 Drawing Sheets

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

SYSTEM IDLE TIME REDUCTION METHODS AND APPARATUS

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). It is important that the process for programming data into the memory system be fast so that the host device (or other client) does not have to wait very long for the memory system to finish programming.

BRIEF DESCRIPTION OF THE DRAWINGS

Like-numbered elements refer to common components in the different figures.

DETAILED DESCRIPTION

Figure 1:
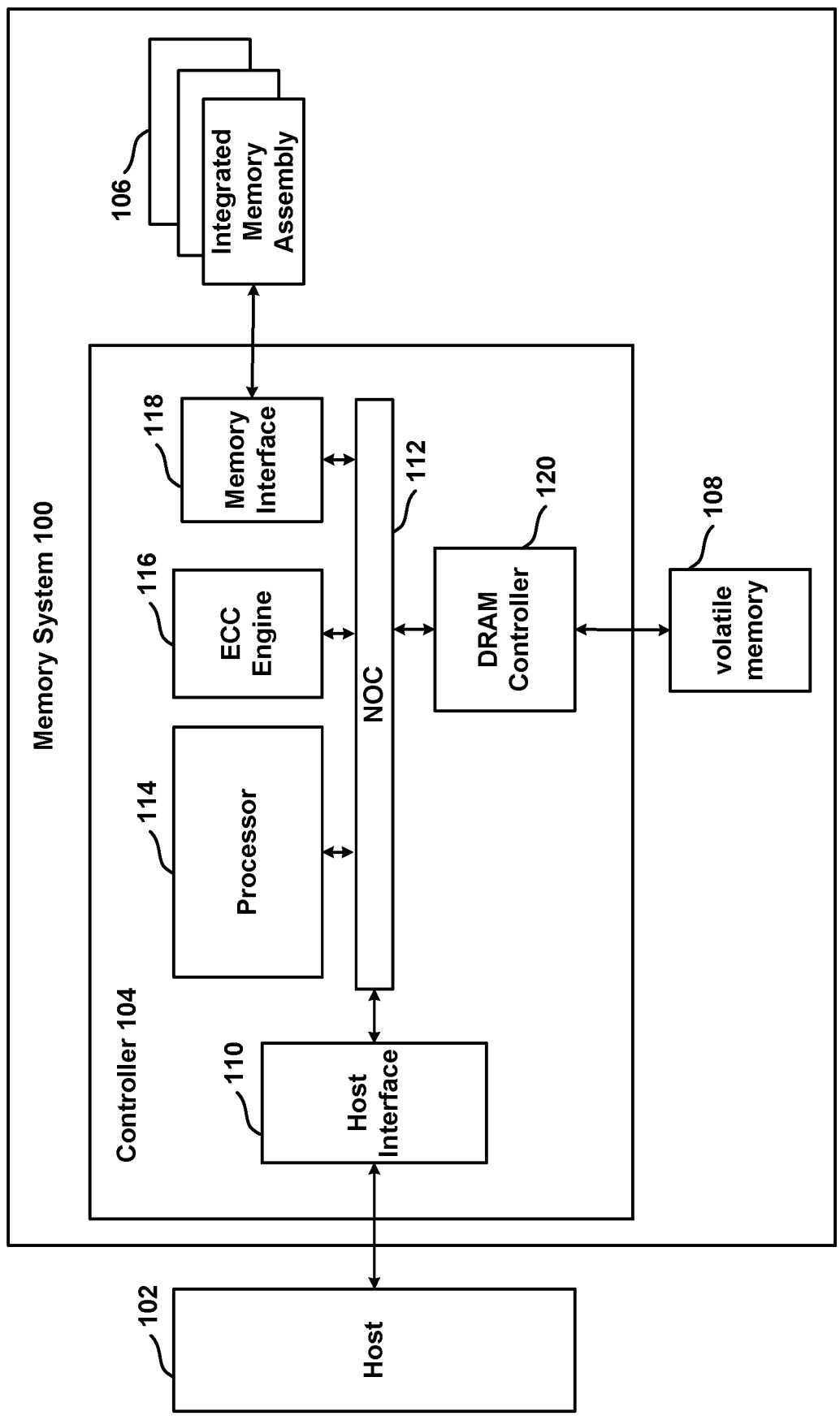
FIG. 1 is a block diagram depicting one embodiment of a memory system.

FIG. 1 is a block diagram of an embodiment of an memory system 100 that implements the described technology. In an embodiment, memory system 100 is a solid state drive ("SSD"). Memory system 100 also can be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from but connected to memory system 100. In other embodiments, memory system 100 is embedded within host 102.

The components of memory system 100 depicted in FIG. 1 are electrical circuits. Memory system 100 includes a controller 104 connected to one or more integrated memory assemblies 106 and local high speed volatile memory 108 (e.g., DRAM). Local high speed volatile memory 108 is used by controller 104 to perform certain functions. For example, local high speed volatile memory 108 stores logical to physical address translation tables.

The one or more integrated memory assemblies 106 each include one or more memory die and one or more control die. Each memory die may include one or more memory structures. A control die may control operations on a memory die. For example, a control die may control and perform read, write, and erase operations on a memory die.

In an embodiment, controller 104 communicates with a control die to instruct the control die to perform read, write, or erase operations on one or more non-volatile memory die or one or more memory structures. In an embodiment, each memory die in an integrated memory assembly 106 utilizes NAND flash memory (including two dimensional NAND flash memory and/or three dimensional NAND flash memory). In other embodiments, each integrated memory assembly 106 can include other types of memory; for example, PCM memory and MRAM.

Controller 104 includes a host interface 110 that is connected to and in communication with host 102. In one embodiment, host interface 110 provides a PCIe interface. Other interfaces can also be used, such as SCSI, SATA, etc. Host interface 110 is also connected to a network-on-chip (NOC) 112, which is a communication subsystem on an integrated circuit. In other embodiments, NOC 112 can be replaced by a bus.

Processor 114, ECC engine 116, memory interface 118, and DRAM controller 120 are connected to and in communication with NOC 112. DRAM controller 120 is used to operate and communicate with local high speed volatile memory 108 (e.g., DRAM). In other embodiments, local high speed volatile memory 108 can be SRAM or another type of volatile memory.

ECC engine 116 performs error correction services (e.g., data encoding and decoding). In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain logical to physical address translation tables that identify a translation between logical addresses and physical addresses. An entry in the logical to physical address translation table may include an identification of a logical address and corresponding physical address. The logical to physical address translation tables can be any type of data structure. In some examples, the memory space of a storage system is so large that local memory 108 cannot hold all of the logical to physical address translation tables. In such a case, the logical to physical address translation tables are stored in an integrated memory assembly 106 and a subset of the logical to physical address translation tables are cached in the local high speed volatile memory 108.

In an embodiment, memory interface 118 communicates with one or more integrated memory assemblies 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2A:
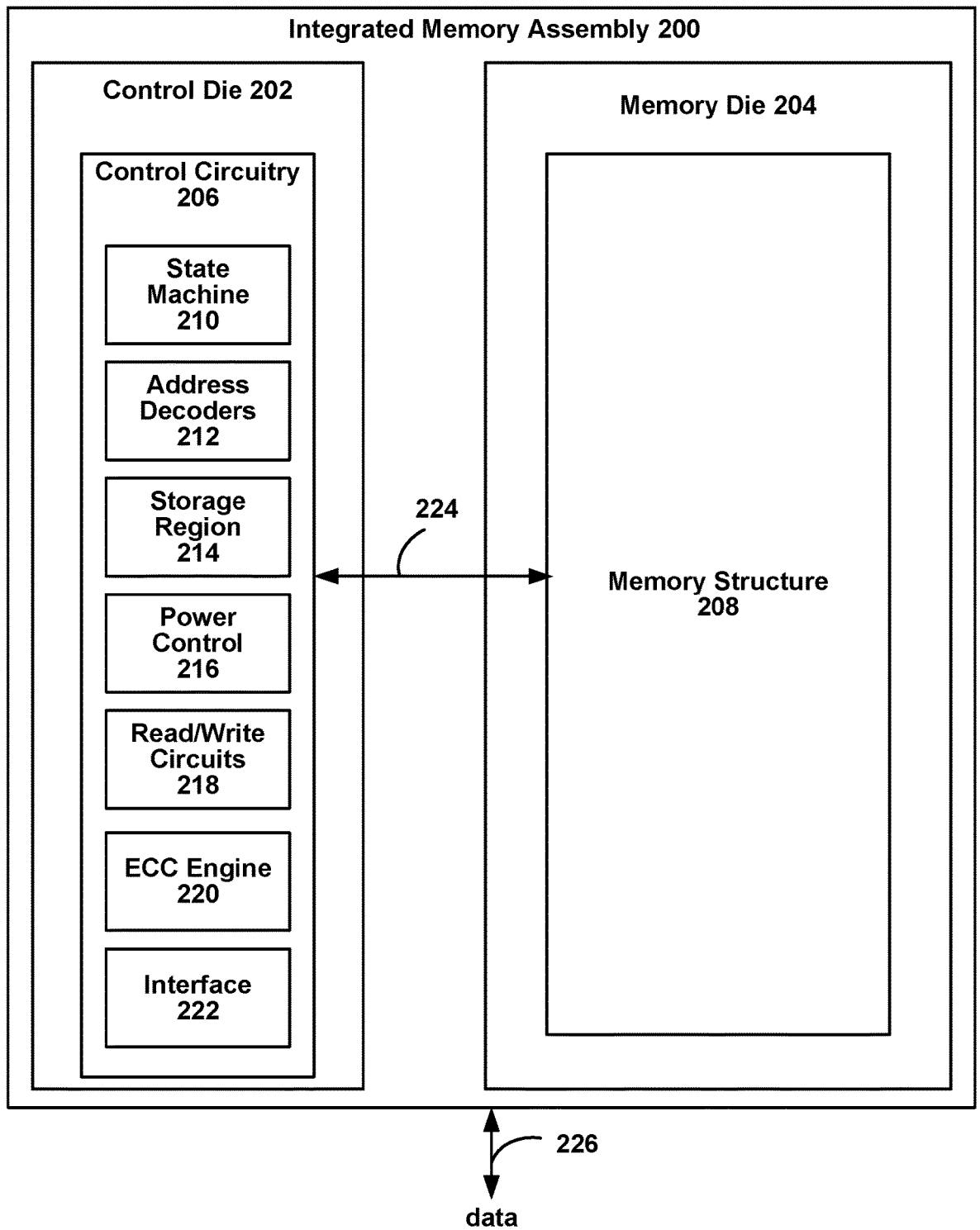
FIG. 2A is a functional block diagram of an integrated memory assembly.

FIG. 2A is a functional block diagram of an embodiment of an integrated memory assembly 200, which is an embodiment of integrated memory assembly 106 of FIG. 1. In an embodiment, integrated memory assembly 200 includes two semiconductor die: control die 202 and memory die 204. Control die 202 includes control circuitry 206. Memory die 204 includes memory structure 208, which may contain non-volatile memory cells. In some embodiments, control die 202 and memory die 204 are bonded together, as will be described in more detail below.

Control circuitry 206 includes electrical circuits that perform memory operations (e.g., write, read, erase and others) on memory structure 208. Control circuitry 206 includes state machine 210, an on-chip address decoder 212, storage region 214, power control circuit 216, read/write circuits 218, ECC engine 220, and memory controller interface 222. In another embodiment, a portion of read/write circuits 218 are located on control die 202 and a portion of read/write circuits 218 are located on memory die 204. For example, read/write circuits 218 may contain sense amplifiers. In an embodiment, the sense amplifiers are located on control die 202, whereas in another embodiment, the sense amplifiers are located on memory die 204.

As used herein, the terms "memory die," "memory semiconductor die," or the like, means a semiconductor die that contains non-volatile memory cells for data storage. As used herein, the terms "control die," "control semiconductor die," or the like, means a semiconductor die that contains control circuitry for performing memory operations on non-volatile memory cells on a memory die. Typically, numerous semiconductor die are formed from a single semiconductor (e.g., silicon) wafer.

State machine 210 is an electrical circuit that controls the operations performed by control die 202. In some embodiments, state machine 210 is implemented by or replaced by a microprocessor, microcontroller and/or RISC processor.

On-chip address decoder 212 provides an address interface between addresses used by host 102 or controller 104 (FIG. 1) to the hardware address used by row decoders and column decoders (not expressly depicted in FIG. 2A).

Storage region 214 can be volatile memory used to store software for programming a processor (e.g., the RISC processor used to implement or replace state machine 210) and for storing data (e.g., data for the decoding process, encoding process and/or folding process). In an embodiment, storage region 214 is implemented with SRMA or DRAM.

Power control circuit 216 controls the power and voltages supplied to the word lines, bit lines, and select lines during memory operations. Power control circuit 216 includes voltage circuitry, in an embodiment. Power control circuit 216 may include charge pumps or other voltage sources for creating voltages. In an embodiment, power control circuit 216 executes under control of state machine 210.

Read/write circuits 218 includes sense blocks (which may contain sense amplifies (SA), in some embodiments. The sense amplifies include bit line drivers, in some embodiments. Read/write circuits 218 executes under control of state machine 210, in an embodiment. Each memory structure 208 is addressable by word lines by way of a row decoder (not depicted in FIG. 2A) and by bit lines by way of a column decoder (not depicted in FIG. 2A), in some embodiments.

Error correction code (ECC) engine 220 is a circuit configured to decode and error correct codewords. As used herein, ECC engine 220 may be referred to as an on-die ECC engine. In an embodiment, on-die ECC engine 220 is configured to encode data bits from controller 104 (FIG. 1) into codewords that contain data bits and parity bits. The control circuitry stores the codewords in memory structure 208.

In an embodiment, on-die ECC engine 220 is also configured to decode the codewords which are read from memory structure 208. In some embodiments, if on-die ECC engine 220 is successful at decoding a codeword, then control die 202 only sends back the data bits to controller 104. In some embodiments, if on-die ECC engine 220 is not successful at decoding a codeword, then a memory controller ECC engine on controller 104 may be used to decode the codeword. In some embodiments, first control die 202 attempts to decode a codeword using ECC engine 220. If decoding fails, controller 104 may attempt to decode that codeword. In some embodiments, controller 104 has multiple ECC modes.

State machine 210, on-die ECC engine 220, and/or controller 104 (or equivalently functioned circuits), in combination with all or a subset of the circuits of control circuitry 206, can be considered one or more control circuits. The one or more control circuits can include hardware only (e.g., electrical circuits) or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), microcontroller, integrated circuit or other type of circuit.

Pathways 224 are pathways between one or more components in control circuitry 206 and memory structure 208 on memory die 204. A portion of each pathway resides in control die 202 and a portion of each pathway resides in memory die 204. The term pathway may be used for a portion of pathways 224 that is entirely within one of the die. Thus, it may be stated that control die 202 has a first plurality of pathways and memory die 204 has a second plurality of pathways.

In an embodiment, control die 202 and memory die 204 are configured to transfer signals through pathway pairs of the first plurality of pathways and the second plurality of pathways. In some embodiments, control die 202 and memory die 204 are bonded to each other, or otherwise attached to each other, to facilitate signal transfer through pathway pairs.

A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal.

In an embodiment, pathways 224 allow control circuitry 206 to provide voltages to word lines, select lines, and bit lines on memory die 204. Pathways 224 may be used to receive signals from, for example, bit lines. In an embodiment, there are about 100,000 pathways 224. However, there could be more or fewer than 100,000 pathways. Having such a large number of pathways 224 allows a very large amount of data, or other signals, to be passed in parallel.

Memory controller interface 222 is an electrical interface for communicating with controller 104 (FIG. 1). For example, memory controller interface 222 may implement a Toggle Mode Interface that connects to the Toggle Mode interfaces of memory interface 118 for controller 104. In an embodiment, memory controller interface 222 includes a set of input and/or output (I/O) pins that connect to a communication channel 226 (also refers to herein as a data bus). In an embodiment, communication channel 226 connects to controller 104 as part of the Toggle Mode Interface. In an embodiment, communication channel 226 of one integrated memory assembly 200 connects to another integrated memory assembly 200.

Communication channel 226 is depicted as being connected to integrated memory assembly 200 for generality. Communication channel 226 may connect to memory die 204. In an embodiment, communication channel 226 connects controller 102 directly to control die 202. In an embodiment, communication channel 226 connects controller 102 directly to memory die 204. If communication channel 226 connects controller 102 directly to memory die 204, then pathway 224 may be used to allow communication between controller 102 and control circuitry 206.

In an embodiment, memory structure 208 includes a monolithic three-dimensional memory array of non-volatile memory cells in which multiple memory levels are formed above a single substrate, such as a wafer. The memory structure may include any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 208 includes a two-dimensional memory array of non-volatile memory cells. In one example, the non-volatile memory cells are NAND flash memory cells utilizing floating gates. Other types of memory cells (e.g., NOR-type flash memory) also can be used.

The exact type of memory array architecture or memory cells included in memory structure 208 is not limited to the examples above. Many different types of memory array architectures or memory technologies can be used to form memory structure 208. No particular non-volatile memory technology is required for purposes of the new claimed embodiments disclosed herein.

Other examples of suitable technologies for memory cells of memory structure 208 include phase change memory ("PCM"), Magnetoresistive Random-Access Memory ("MRAM"), and the like. Examples of suitable technologies for memory cell architectures of memory structure 208 include two-dimensional arrays, three-dimensional arrays, cross-point arrays, stacked two-dimensional arrays, vertical bit line arrays, and the like.

Although FIG. 2A depicts one control die 202 and one memory die 204 in an integrated memory assembly 200, there may be more than one control die 202 and more than one memory die 204 in an integrated memory assembly 200.

In embodiments, control die 202 and memory die 204 may be bonded together (e.g., via bond pads on each of control die 202 and memory die 204). In addition, as described above, integrated memory assembly 200 may include a stack of multiple control die 202 and multiple memory die 204.

Figure 2B:
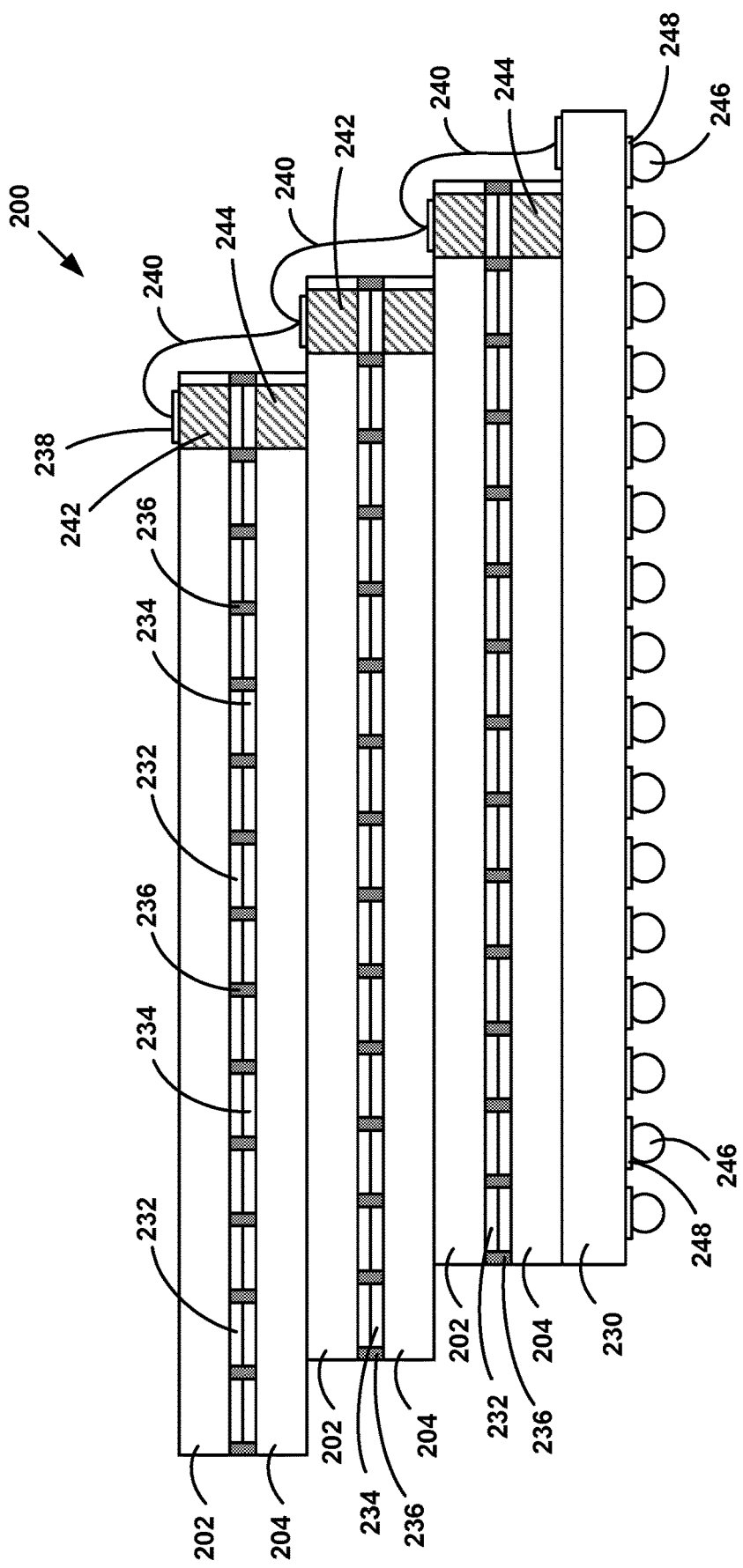
FIG. 2B depicts a side view of an embodiment of an integrated memory assembly stacked on a substrate.

FIG. 2B depicts a side view of an embodiment of an integrated memory assembly 200 stacked on a substrate 230. Integrated memory assembly 200 includes three control die 202 and three memory die 204. Each control die 202 includes multiple bond pads 232, and each memory die 204 includes multiple bond pads 234. Each control die 202 is bonded to and in communication with one of the memory die 204. Some of bond pads 232 and 234 are depicted, although there may be many more bond pads 232 and 234.

A solid layer 236 (e.g., epoxy or other resin or polymer) fills the space between the bonded control die 202 and memory die 204. Solid layer 236 protects the electrical connections between control die 202 and memory die 204, and further secures the die together. Various materials may be used as solid layer 236, but in embodiments, it may be Hysol epoxy resin from Henkel Corp., having offices in California, USA.

Integrated memory assembly 200 may for example be stacked with a stepped offset, leaving bond pads 238 on each control die 202 uncovered and accessible from above. Wire bonds 240 connected to bond pads 238 connect control die 202 to substrate 230. A number of such wire bonds may be formed across the width of each control die 202 (e.g., into the page of FIG. 2B).

A through silicon via (TSV) 242 may be used to route signals through each control die 202, and a TSV 244 may be used to route signals through each memory die 204. TSVs 242 and 244 may be formed before, during or after formation of the integrated circuits in control die 202 and memory die 204. The TSVs may be formed by etching holes through the wafers. The holes may then be lined with a barrier layer against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

In an embodiment, solder balls 246 are affixed to contact pads 248 on a lower surface of substrate 202. In an embodiment, solder balls 246 are used to electrically and mechanically couple integrated memory assembly 200 to a host device (not shown), such as a printed circuit board. Solder balls 246 may be omitted where integrated memory assembly 200 is used as an LGA package. In an embodiment, solder balls 246 form part of the interface between integrated memory assembly 200 and controller 104 (FIG. 1).

Figure 3:
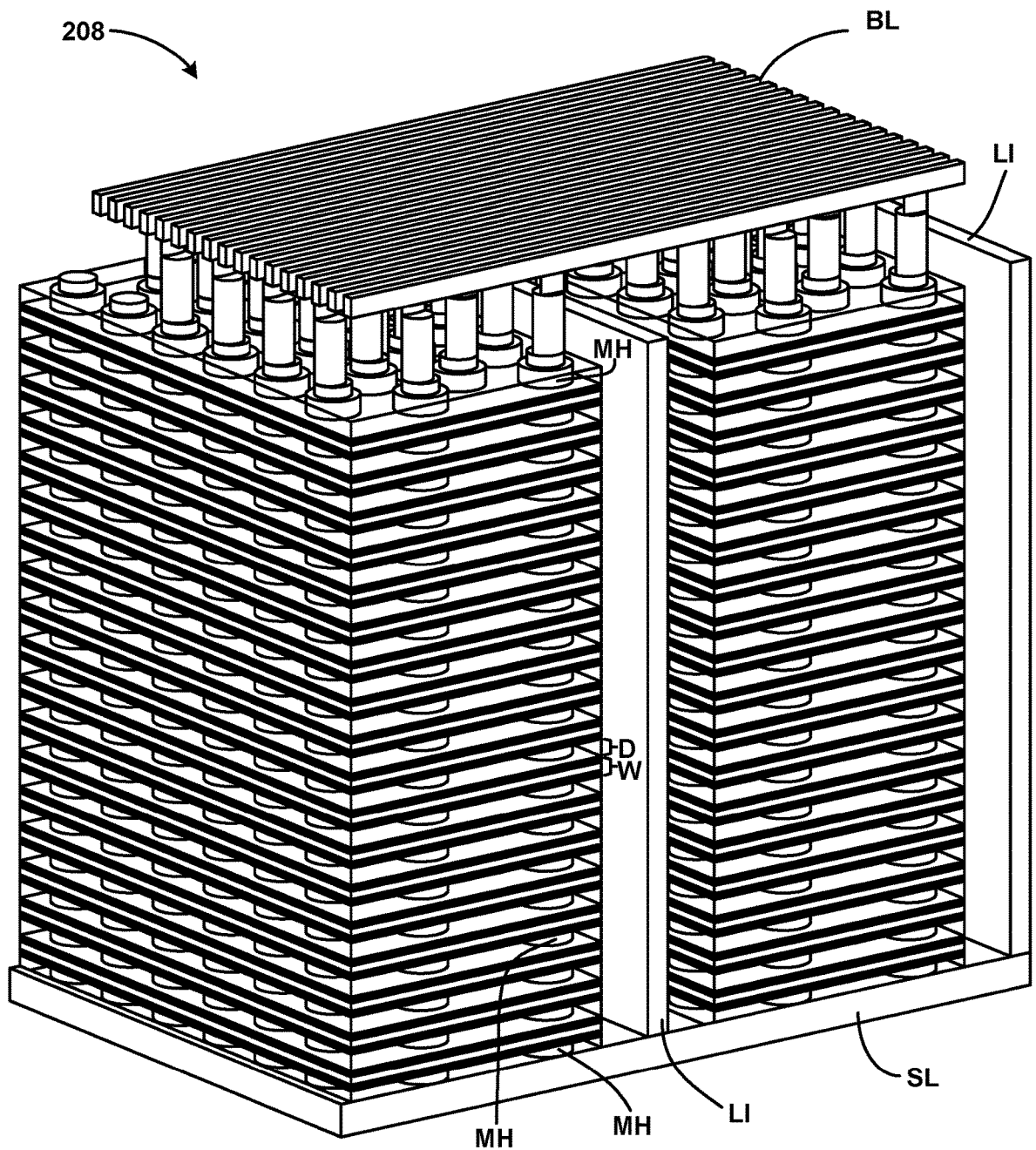
FIG. 3 is a perspective view of a portion of one embodiment of a three dimensional memory structure.

FIG. 3 is a perspective view of a portion of an embodiment of a three dimensional memory array that includes memory structure 208. In an embodiment, memory structure 208 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI.

Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers.

In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of the three dimensional memory array that comprises memory structure 208 is provided below with respect to FIG. 4A-4F.

Figure 4A:
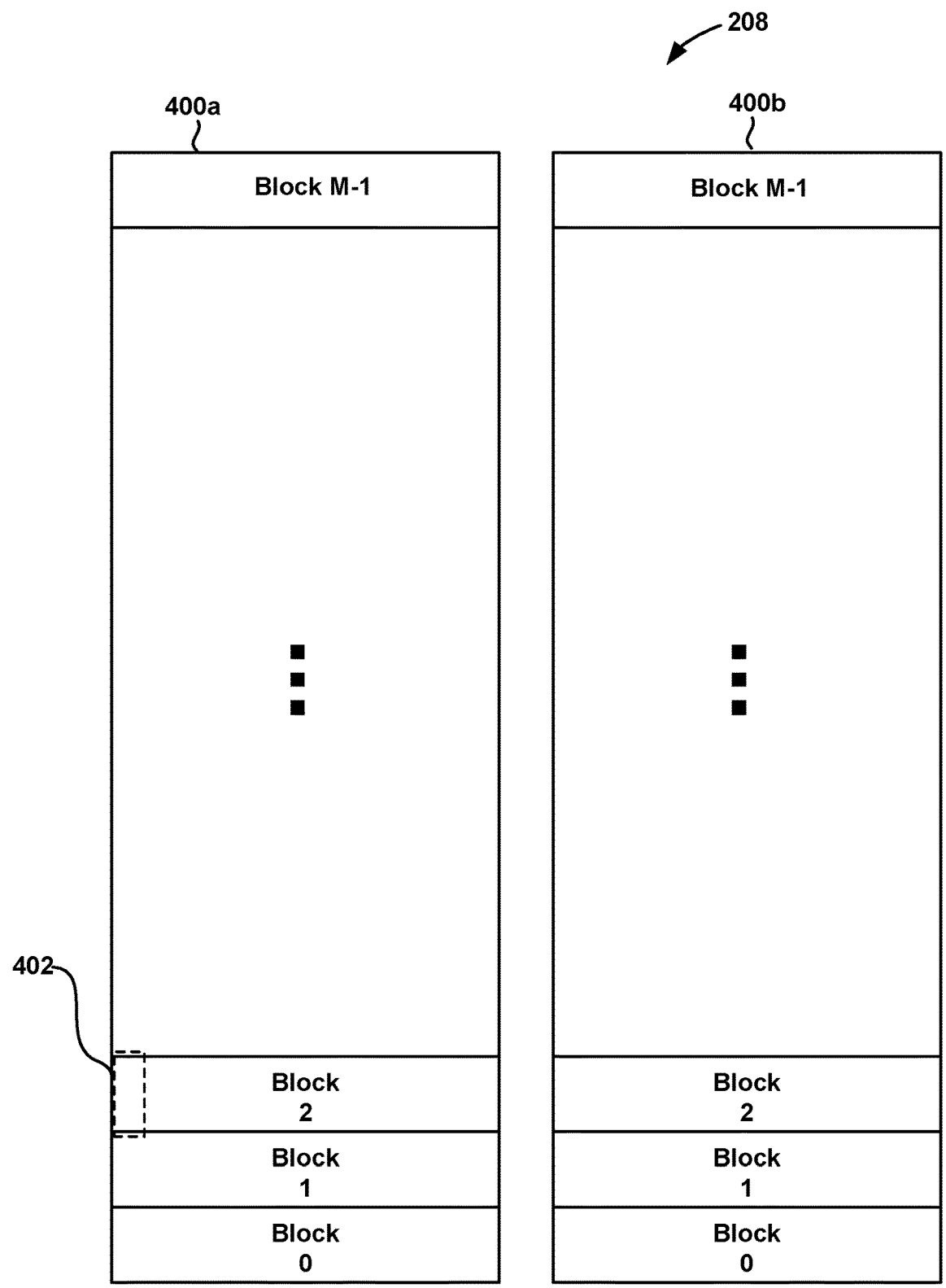
FIG. 4A is a block diagram of a memory structure having two planes.

FIG. 4A is a block diagram explaining one example organization of memory structure 208, which is divided into two planes 400a and 400b. Both planes are on the same memory die 204 (see FIG. 2A). Each plane is then divided into M blocks. In one example, each plane has about 2000 blocks. However, different numbers of blocks and planes also can be used. A portion 402 of block 2 of memory plane 400a is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 208 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
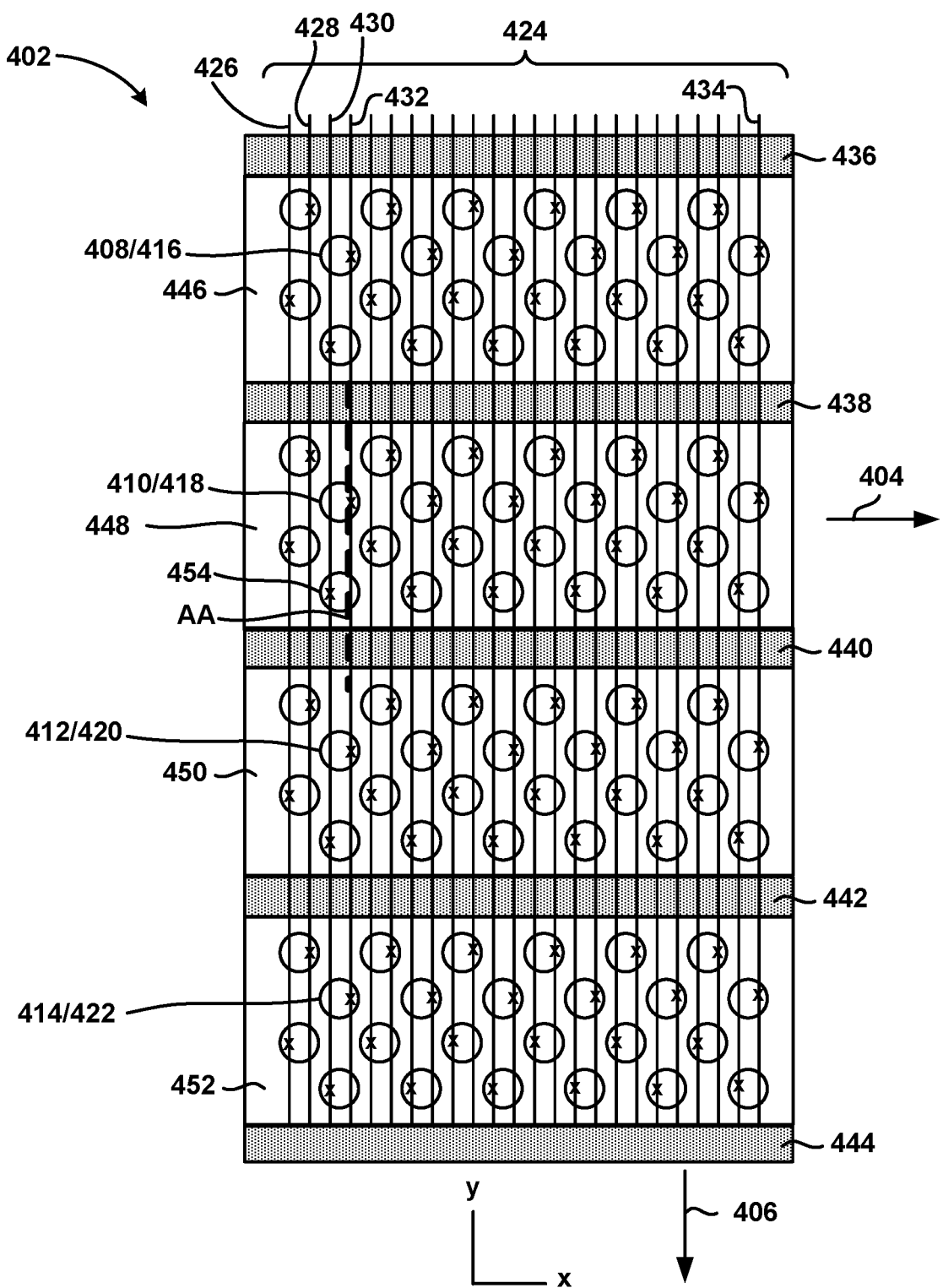
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of portion 402 (FIG. 4A) of memory structure 208. As can be seen from FIG. 4B, portion 402 extends in direction 404 and direction 406. In an embodiment, the memory array has many layers, however, FIG. 4B only shows the top layer.

FIG. 4B depicts a plurality of circles that represent the memory holes, which are also referred to as memory columns. Each of the memory holes include multiple select transistors (also referred to as a select gate or selection gate) and multiple memory cells. In an embodiment, each memory hole implements a NAND string.

For example, FIG. 4B depicts memory holes 408, 410, 412 and 414. Memory hole 408 implements NAND string 416. Memory hole 410 implements NAND string 418. Memory hole 412 implements NAND string 420. Memory hole 414 implements NAND string 422. More details of the memory holes are provided below. Because portion 402 extends in directions 404 and 406, the block includes more memory holes than depicted in FIG. 4B.

FIG. 4B also depicts a set of bit lines 424, including bit lines 426, 428, 430, 432, . . . 434. In an embodiment, each memory hole is associated with and coupled to a corresponding one of the bit lines. In an embodiment, each bit line is coupled to one or more memory holes. FIG. 4B shows twenty four bit lines because only a portion of the block is depicted. It is contemplated that more than twenty four bit lines connected to memory holes of the block. Each of the circles representing memory holes has an "x" to indicate its connection to one bit line. For example, bit line 432 is connected to memory holes 408, 410, 412 and 414.

Portion 402 depicted in FIG. 4B includes a set of local interconnects 436, 438, 440, 442 and 444 that connect the various layers to a source line below the memory holes. Local interconnects 436, 438, 440, 442 and 444 also serve to divide each layer of the block into four regions. For example, the top layer depicted in FIG. 4B is divided into regions 446, 448, 450 and 452, which are referred to as fingers. In the layers of the block that implement memory cells, regions 446, 448, 450 and 452 are referred to as word line fingers that are separated by the local interconnects.

In an embodiment, the word line fingers on a common level of a block connect together to form a single word line. In another embodiment, the word line fingers on the same level are not connected together. In one example implementation, a bit line only connects to one memory hole in each of regions 446, 448, 450 and 452. In that implementation, each block has sixteen rows of active columns and each bit line connects to four rows in each block.

In an embodiment, all of four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows each of regions 446, 448, 450 and 452 having four rows of memory holes, four regions and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

Figure 4C:
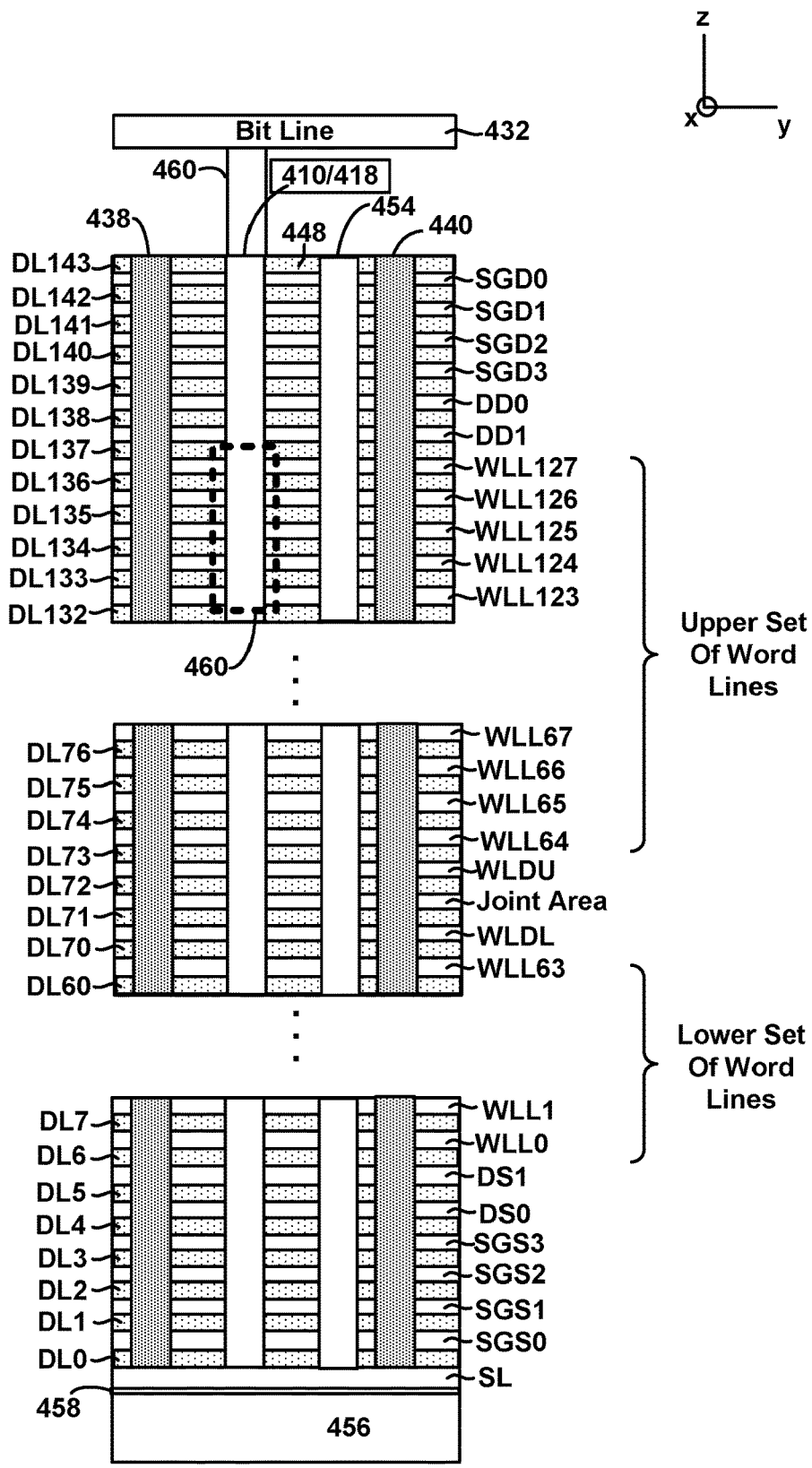
FIG. 4C depicts a cross sectional view of a portion of a block of memory cells.

FIG. 4C depicts a portion of one embodiment of a three dimensional memory structure 208 showing a cross-sectional view along line AA of FIG. 4B. This cross sectional view cuts through memory holes 410 and 454 and region 448 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twenty eight data word line layers WLL0-WLL127 for connecting to memory cells. Other embodiments can implement more or less than four drain side select layers, more or less than four source side select layers, more or less than six dummy word line layers, and more or less than one hundred and twenty eight word lines.

Memory holes 410 and 454 are depicted protruding through the drain side select layers, source side select layers, dummy word line layers and word line layers. In one embodiment, each memory hole includes a vertical NAND string. For example, memory hole 410 includes NAND string 418. Below the memory holes and the layers listed below is substrate 456, an insulating film 458 on the substrate, and source line SL. The NAND string of memory hole 410 has a source end at a bottom of the stack and a drain end at a top of the stack. As in agreement with FIG. 4B, FIG. 4C show memory hole 410 connected to bit line 432 via connector 460. Local interconnects 438 and 440 are also depicted.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL127 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL143. For example, dielectric layers DL136 is above word line layer WLL126 and below word line layer WLL127. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL127 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred and twenty-eight word line layers intermixed with dielectric layers. To ease this burden, one embodiment includes laying down a first stack of sixty four word line layers alternating with dielectric layers, laying down the Joint Area, and laying down a second stack of sixty four word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
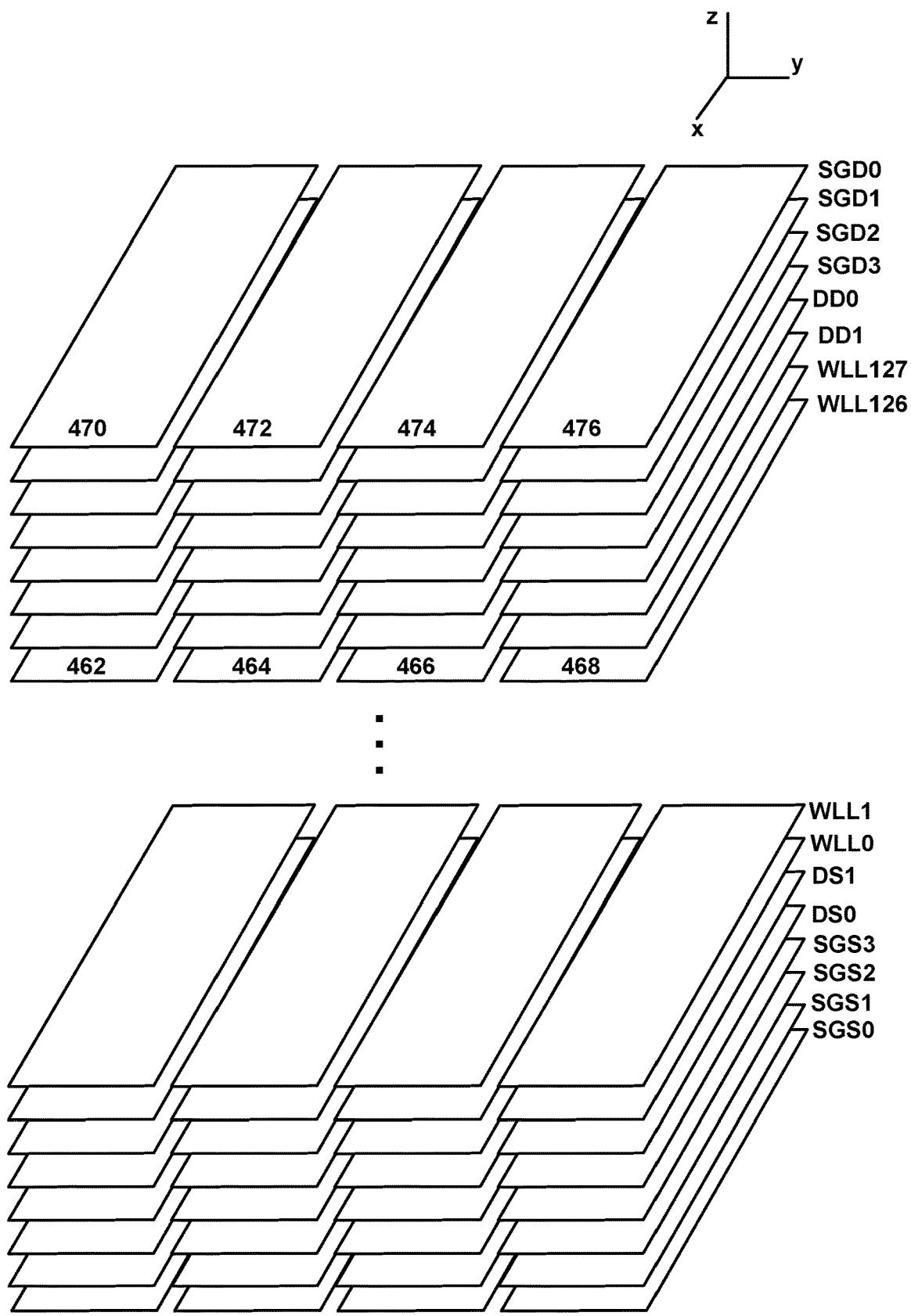
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 4C. As mentioned above with respect to FIG. 4B, in an embodiment local interconnects 436, 438, 440, 442 and 444 break up the conductive layers into four regions/fingers.

For example, word line layer WLL126 is divided into regions 462, 464, 466 and 468. In an embodiment, the four word line fingers on a same level are connected together. In another embodiment, each word line finger operates as a separate word line. Likewise, drain side select gate layer SGD0 (the top layer) is divided into regions 470, 472, 474 and 476, also known as fingers or select line fingers. In an embodiment, the four select line fingers on a same level are connected together. In another embodiment, each select line finger operates as a separate word line.

Figure 4E:
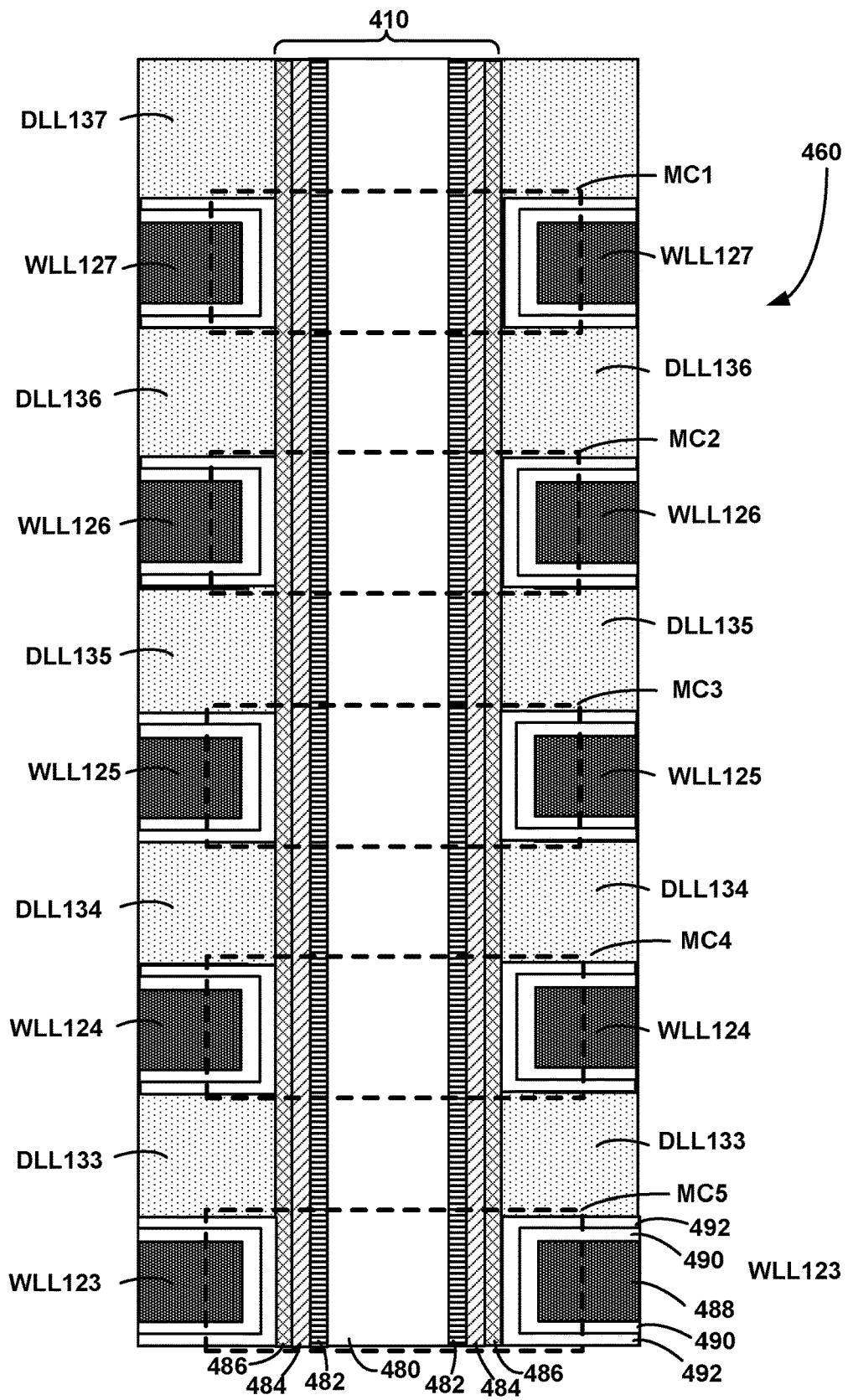
FIG. 4E is a cross sectional view of a memory hole of memory cells.

FIG. 4E depicts a cross sectional view of region 460 of FIG. 4C that includes a portion of memory hole 410. In an embodiment, the memory holes (e.g., memory hole 410) are shaped as cylinders. In other embodiment, however, memory holes may have other shapes. In an embodiment, memory hole 410 includes an inner core layer 480, a channel 482 surrounding inner core layer 480, a tunneling dielectric 484 surrounding channel 482, and a charge trapping layer 486 surrounding tunneling dielectric 484. In an embodiment, inner core layer 480 a dielectric material (e.g., $SiO_2$), channel 482 is polysilicon, tunneling dielectric 484 has an ONO structure, and charge trapping layer 486 is silicon nitride. Other memory materials and structures can also be used. The technology described herein is not limited to any particular material or structure.

FIG. 4E depicts dielectric layers DLL137, DLL136, DLL135, DLL134 and DLL133, as well as word line layers WLL127, WLL126, WLL125, WLL124, and WLL123. In an embodiment, each of the word line layers includes a word line region 488 surrounded by an aluminum oxide layer 490, which is surrounded by a blocking oxide ($SiO_2$) layer 492. The physical interaction of the word line layers with the memory hole forms the memory cells. Thus, a memory cell, in an embodiment, includes channel 482, tunneling dielectric 484, charge trapping layer 486, blocking oxide layer 492, aluminum oxide layer 490 and word line region 488.

For example, word line layer WLL127 and a portion of memory hole 410 comprise a memory cell MC1. Word line layer WLL126 and a portion of memory hole 410 comprise a memory cell MC2. Word line layer WLL125 and a portion of memory hole 410 comprise a memory cell MC3. Word line layer WLL124 and a portion of memory hole 410 comprise a memory cell MC4. Word line layer WLL123 and a portion of memory hole 410 comprise a memory cell MC5. In other architectures, a memory cell may have a different structure; however, the memory cell would still be the storage unit.

In an embodiment, when a memory cell is programmed, electrons are stored in a portion of the charge trapping layer 486 which is associated with the memory cell. These electrons are drawn into the charge trapping layer 486 from the channel 482, through the tunneling dielectric 484, in response to an appropriate voltage on word line region 488. The threshold voltage (Vth) of a memory cell is increased in proportion to the amount of stored charge.

In an embodiment, programming a memory cell is achieved through Fowler-Nordheim tunneling of the electrons into charge trapping layer 486. During an erase operation, the electrons return to channel 482 or holes are injected into charge trapping layer 486 to recombine with electrons. In an embodiment, erasing is achieved using hole injection into charge trapping layer 486 via a physical mechanism such as gate induced drain leakage (GIDL).

Figure 4F:
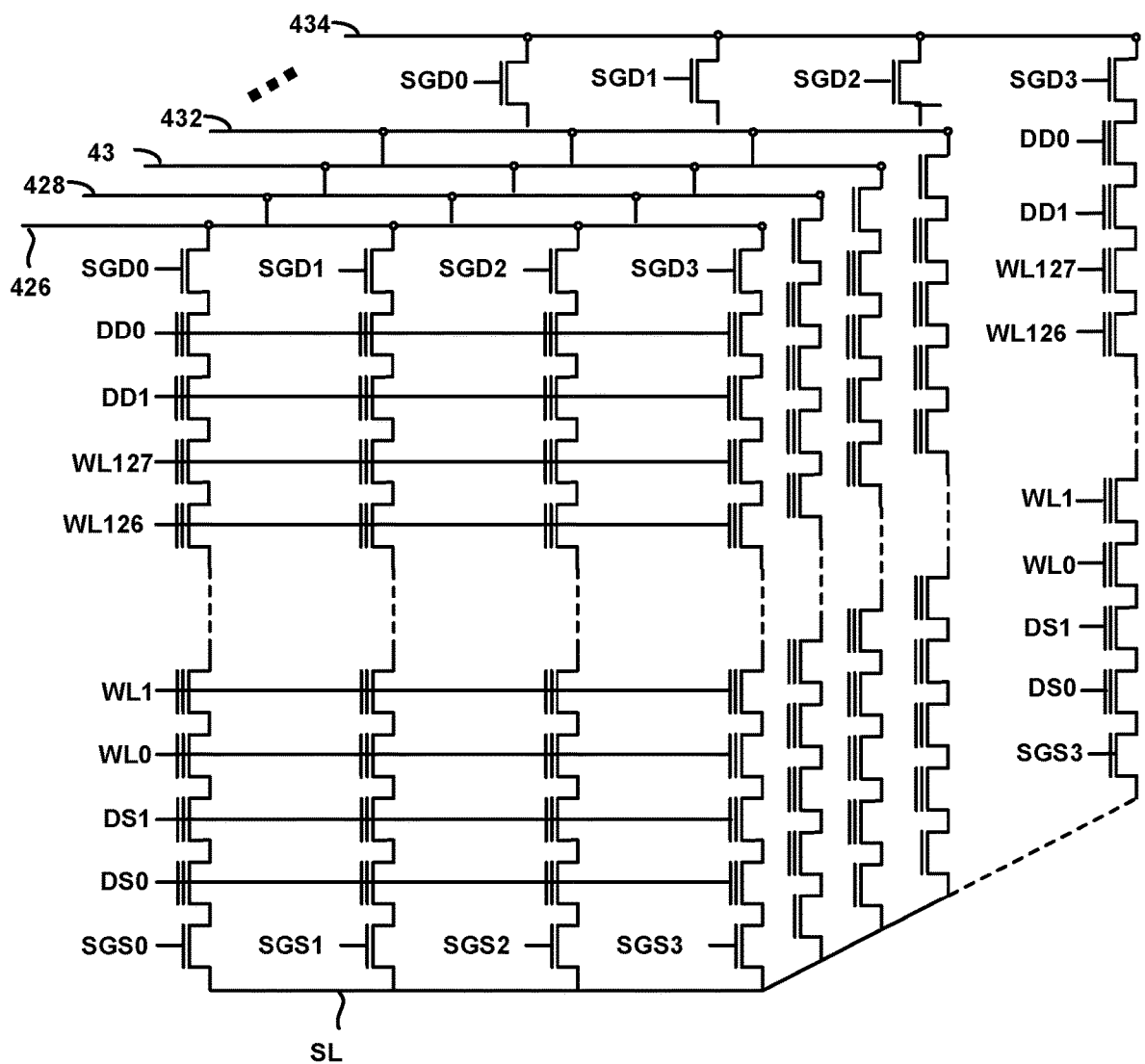
FIG. 4F is a schematic of a plurality of NAND strings.

FIG. 4F is a schematic diagram of corresponding to portion 402 in Block 2 of FIGS. 4A-E, including bit lines 426, 428, 430, 432, . . . 434, and word lines WLL0-WLL127. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIGS. 3-4F is a three dimensional memory structure that includes vertical NAND strings with charge-trapping material, other (2D and 3D) memory structures also can be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

Figures 5, 6:
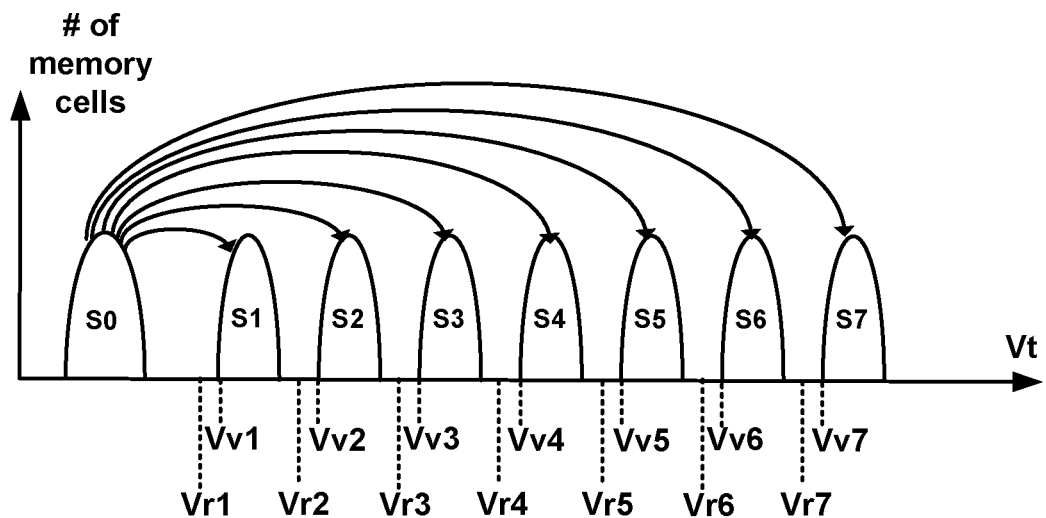
FIG. 5 depicts threshold voltage distributions.
FIG. 6 is a table describing one example of an assignment of data values to data states.

FIG. 5 illustrates example threshold voltage distributions for a memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states.

Each threshold voltage distribution (data state) corresponds to predetermined values for the set of data bits. The specific relationship between the data programmed into a memory cell and the threshold voltage levels of the memory cell depends upon the data encoding scheme adopted for the cells. In an embodiment, data values are assigned to the threshold voltage ranges using a Gray code assignment so that if the threshold voltage of a memory cell erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (S0, S1, S2, S3, . . . , S7) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In an embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on.

The arrows of FIG. 5 represent full sequence programming. The technology described herein also can be used with other types of programming in addition to full sequence programming (including, but not limited to, multiple stage/phase programming). In some embodiments, data states S1-S7 can overlap, with controller 104 (FIG. 1) relying on error correction to identify the correct data being stored.

FIG. 6 is a table describing an example assignment of data values to data states. In the table of FIG. 6, S0=111. S1=110, S2=100, S3=000, S4=010, S5=011, S6=001 and S7=101. Other encodings of data also can be used. No particular data encoding is required by the technology disclosed herein. In an embodiment, when a block is subjected to an erase operation, all memory cells are moved to data state S0, the erased state. In the embodiment of FIG. 6, all bits stored in a memory cell are 1 when the memory cell is erased (e.g., in data state S0).

Figure 7:
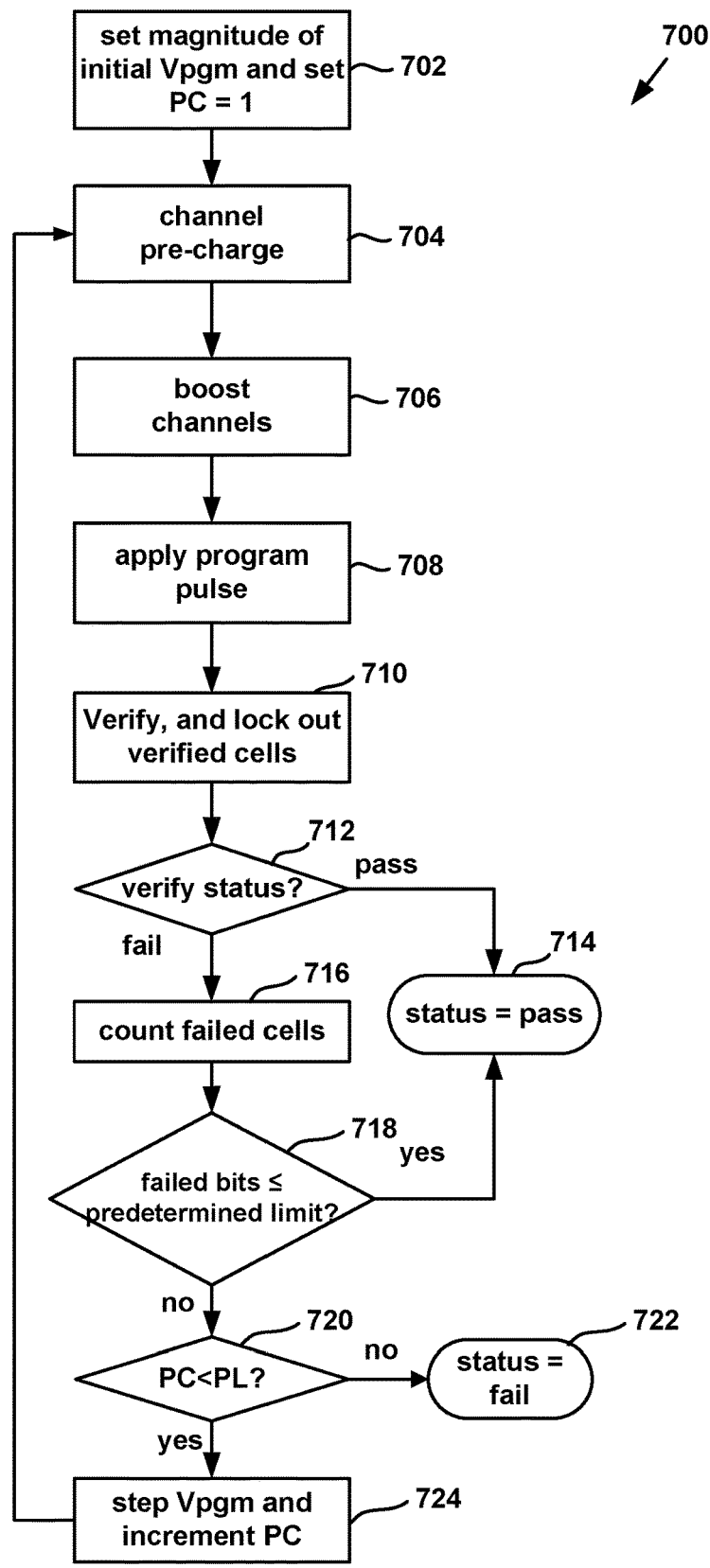
FIG. 7 is a flow chart describing one embodiment of a process for programming non-volatile memory.

FIG. 7 is a flowchart describing an embodiment of a process 700 for programming a memory cell. In one example embodiment, process 700 is performed on integrated memory assembly 106 (FIG. 1) using the control circuit discussed above. For example, process 700 can be performed at the direction of state machine 210 (FIG. 2A). Process 700 also can be used to implement the full sequence programming discussed above. Additionally, process 700 can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 702 of FIG. 7, the programming voltage (Vpgm) is initialized to the starting magnitude (e.g., ~12-16V or another suitable level) and a program counter PC maintained by state machine 216 is initialized at 1.

In an embodiment, the group of memory cells in a same block that are selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming.

For example, when data are written to a set of memory cells, some of the memory cells will need to store data associated with state S0, and thus such memory cells will not be programmed. Additionally, as memory cells reach their intended target data state, such memory cells will be inhibited from further programming. Those NAND strings that include memory cells connected to the selected word line that are to be inhibited from programming have their channels boosted to inhibit programming. When a channel has a boosted voltage, the voltage differential between the channel and the word line is not large enough to cause programming.

To assist in the boosting, in step 704 the memory system will pre-charge channels of NAND strings that include memory cells connected to the selected word line that are to be inhibited from programming. In some embodiments, only the drain side of the channel is pre-charged. By "drain side" it is meant the portion of the NAND string on the same side of the selected word line as the bit line connection.

In step 706, NAND strings that include memory cells connected to the selected word line that are to be inhibited from programming have their channels boosted to inhibit programming. In one embodiment, the unselected word lines receive one or more boosting voltages (e.g., ~7-11 volts) to perform boosting schemes known in the art.

In step 708, a program pulse of the program signal Vpgm is applied to the selected word line (the word line selected for programming). If a memory cell should be programmed, then the corresponding bit line is grounded. On the other hand, if the memory cell should remain at its current threshold voltage, then the corresponding bit line is connected to Vdd to inhibit programming.

In step 708, the program pulse is applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 710, the appropriate memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 712, it is determined whether all the memory cells have reached their target threshold voltages (pass). If so, the programming process is complete and successful because all selected memory cells were programmed and verified to their target states. A status of "PASS" is reported in step 714. If, in step 712, it is determined that not all of the memory cells have reached their target threshold voltages (fail), then the programming process continues to step 716.

In step 716, the memory system counts the number of memory cells that have not yet reached their respective target threshold voltage distribution. That is, the system counts the number of memory cells that have, so far failed the verify process. This counting can be done by state machine 210 (FIG. 2A), controller 104 (FIG. 1), or other logic. In an embodiment, each of the sense blocks in read/write circuits 218 (FIG. 2A) will store the status (pass/fail) of their respective memory cells. In an embodiment, there is one total count, which reflects the total number of memory cells currently being programmed that have failed the last verify step. In another embodiment, separate counts are kept for each data state.

In step 718, it is determined whether the count from step 716 is less than or equal to a predetermined limit. In an embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 714. In this situation, enough memory cells programmed correctly such that the few remaining memory cells that have not been completely programmed can be corrected using ECC during the read process.

In some embodiments, the predetermined limit used in step 718 is below the number of bits that can be corrected by error correction codes (ECC) during a read process to allows for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 720 and the program counter PC is checked against the program limit value (PL). Examples of program limit values include 6, 12, 16, 20 and 30, although other values can be used. If the program counter PC is not less than the program limit value PL, then the program process is considered to have failed and a status of FAIL is reported in step 722.

If the program counter PC is less than the program limit value PL, then the process continues at step 724 in which the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 724, the process loops back to step 704 and another program pulse is applied to the selected word line so that another iteration (steps 704-724) of programming process 700 is performed.

In general, during verify operations and read operations, the selected word line is connected to a voltage (one example of a reference signal), a level of which is specified for each read operation (e.g., read compare levels Vr1, Vr2, Vr3, Vr4, Vr5, Vr6, and Vr7, of FIG. 5) or verify operation (e.g. verify target levels Vv1, Vv2, Vv3, Vv4, Vv5, Vv6, and Vv7 of FIG. 5) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction state (conductive or non-conductive) of a memory cell during a read or verify operation. In a current sensing technique, the bit line coupled to the selected memory cell is coupled to a pre-charged capacitor in a current sensing module. If the selected memory cell is in a conductive state, the pre-charged capacitor discharges through the bit line and the NAND string into the source line. In contrast, if the selected memory cell is in a non-conductive state, the pre-charged capacitor does not appreciably discharge.

After a predetermined time period, the capacitor voltage is compared to one or more predetermined reference voltages to determine the conductive state of the selected memory cell. For example, for a memory cell that stores one bit of data, if the capacitor voltage is greater than a predetermined reference voltage, the memory cell is deemed to be non-conducting (e.g., OFF). Alternatively, if the capacitor voltage is less than the predetermined reference voltage, the memory cell is deemed to be conducting (e.g., ON).

Figure 8A:
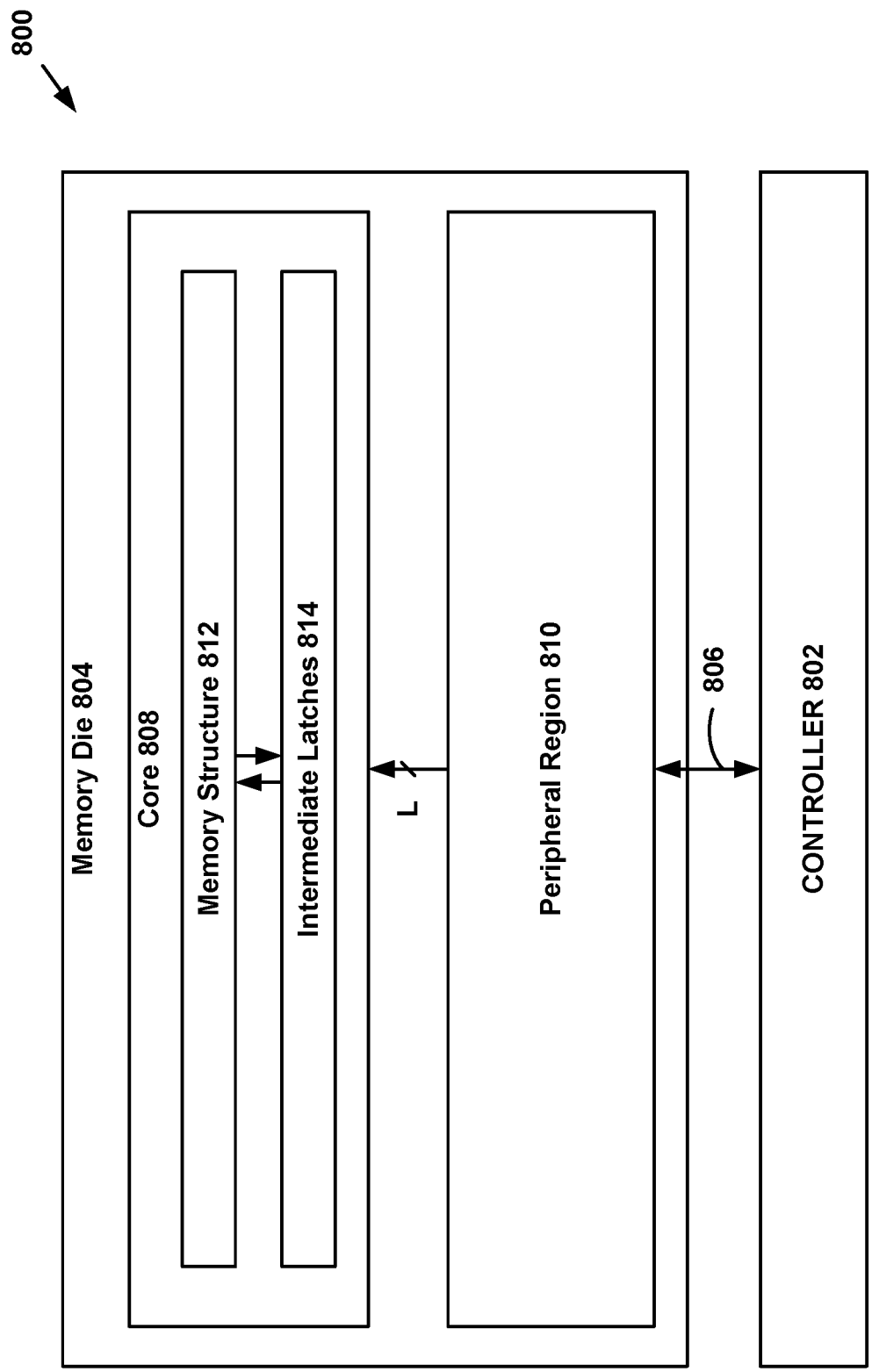
FIG. 8A is a diagram depicting an integrated memory assembly.

FIG. 8A is a diagram depicting an integrated memory assembly 800 that includes a controller 802 and a memory die 804. Integrated memory assembly 800 is an embodiment of integrated memory assembly 200 of FIG. 2A, controller 802 is an embodiment of control die 202 of FIG. 2A, and memory die 804 is an embodiment of memory die 204 of FIG. 2A. Although a single memory die 804 is shown in FIG. 8A, integrated memory assembly 800 may include multiple memory die 804. In addition, integrated memory assembly 800 may include circuits other than or in addition to those shown in FIG. 8A.

In an embodiment, controller 802 and memory die 804 are on two separate integrated circuit devices, such as described above in connection with FIGS. 2A-2B. In other embodiments, controller 802 and memory die 804 are on a single integrated circuit device. In an embodiment, controller 802 and memory die 804 communicate commands, data, control signals, clock signals and other signals over a communication channel 806, which may be a Toggle Mode Interface or other interface.

Memory die 804 includes a memory core 808 and a peripheral region 810. In an embodiment, memory core 808 includes a memory structure 812 and intermediate latches 814, but also may include circuits other than or in addition to those shown in FIG. 8A. Memory structure 812 is an embodiment of memory structure 208 of FIG. 2A. In an embodiment, peripheral region 810 includes circuitry configured to process data for communication between controller 802 and memory die 804.

In an embodiment, controller 802 sends commands for memory operations such as read, write and erase, and other control signals, clock signals and data to memory die 804. For example, controller 802 may send a "data-in" command to write data to memory die 804. In an embodiment, controller 802 communicates data and corresponding clock signals for the data to be written to memory die 804 via communication channel 806.

In an embodiment, a write operation is a two-step process. In a first step, peripheral region 810 receives the data to be written from controller 802, accumulates the data to create large chunks of data, and then pushes each data chunk to intermediate latches 814 of memory core 808. In a second step, each data chunk stored in intermediate latches 814 are then written to memory structure 812.

For example, in a first step, peripheral region 810 receives the data to be written in 8-bit bytes from controller 802, accumulates the data to create L-bit chunks of data, and then pushes each L-bit data chunk to intermediate latches 814 of memory core 808, where L is an integer value (e.g., L=128 or some other value). In a second step, each L-bit data chunk stored in intermediate latches 814 are then written to memory structure 812. This process continues, in L-bit data chunks at a time, until all of the data to be written have been written to memory structure 812. Although not depicted in FIG. 8A, peripheral region 810 also provides control signals with the L-bit data chunks for storing the data in intermediate latches 814.

In an embodiment, during a write operation controller 802 sends data to be written and a corresponding clock signal to memory die 804. In an embodiment, controller 802 sends memory die 804 a corresponding clock signal that includes one clock cycle for each 16-bit word of data to be written. Thus, for example, if controller 802 sends six words of data to be written to memory die 804, controller 802 also sends memory die 804 a corresponding clock signal that includes six clock cycles. Other bit sizes and numbers of clock cycles per word may be used.

Because of latency through circuitry in peripheral region 810, the number of clock cycles provided by controller 802 is not sufficient to push all of the data through to intermediate latches 814. So peripheral region 810 includes an internal oscillator (not shown) to generate the extra clock cycles needed to push the data to intermediate latches 814.

Figure 8B:
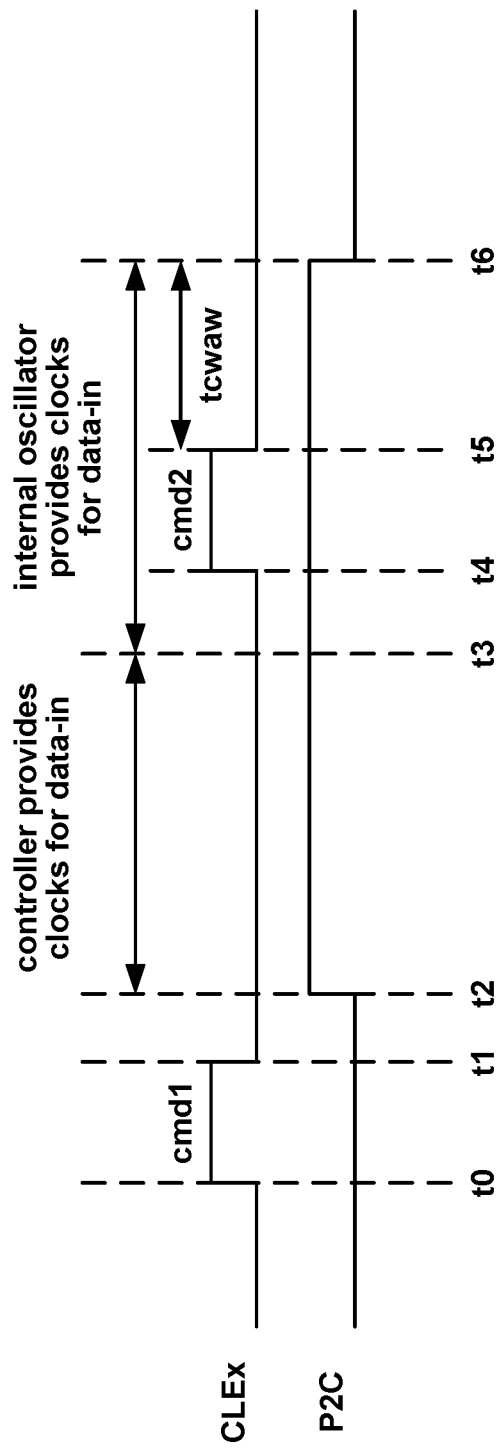
FIG. 8B is a timing diagram depicting control I/O signals used by the integrated memory assembly of FIG. 8A.

FIG. 8B is a timing diagram depicting two control signals used by controller 802 and memory die 804: a command latch enable (CLEx) signal and peripheral-to-core (P2C) signal. In an embodiment, controller 802 sets CLEx HIGH while sending a command to memory die 804, and LOW otherwise, and memory die 804 sets P2C HIGH during a data-in cycle, and LOW otherwise. In an embodiment, P2C going from HIGH to LOW indicates the end of a data-in operation.

In the illustrated example, prior to time t0, CLEx and P2C are both LOW. At time t0, controller 802 sets CLEx HIGH and sends a first command cmd1 to memory die 804. In an example, first command cmd1 is a data-in command. At time t1, after communicating first command cmd1 to memory die 804, controller 802 sets CLEx LOW.

At time t2, memory die 804 sets P2C HIGH, and controller 802 provides the data to be written and corresponding clock cycles to memory die 804. At time t3, controller 802 completes sending the data and corresponding clock signals to memory die 804. Although controller 802 completes sending the data and corresponding clock signals to memory die 804 at time t3, all of the data to be written have not yet been pushed to intermediate latches 814. Accordingly, between time t5 and time t6, the internal oscillator of peripheral region 810 (FIG. 8A) generates additional clock cycles that are needed to push the data to intermediate latches 814.

At time t4, controller 802 sets CLEx HIGH and begins sending a second command cmd2 to memory die 804. In an example, second command cmd2 can be any command (e.g., data-in, data-out, a dummy command, an erase command, etc.). At time t5, after communicating second command cmd2 to memory die 804, controller 802 sets CLEx LOW.

At time t6, memory die 804 sets P2C LOW, indicating that all data have been pushed through to intermediate latches 814. Until P2C goes LOW, however, memory die 804 cannot begin processing second command cmd2.

Indeed, if memory die 804 began processing second command cmd2 before all data from the data-in command have been pushed to intermediate latches 814, the data still in the pipeline could be lost. Thus, between time t5 and t6, controller 802 remains idle. This idle time following a data-in command is a specification sometimes referred to as "tcwaw." In some implementations, tcwaw has a specified value of 300 ns.

As requirements for memory speed increase, system idle times, such as tcwaw, become bottlenecks to improving overall system performance. Technology is described for reducing the tcwaw idle time. Without wanting to be bound by any particular theory, it is believed that reducing controller idle time following a data-in command may improve overall system performance. In addition, without wanting to be bound by any particular theory, it is believed that reducing controller idle time following a data-in command may enable increased memory speed.

Figure 8C:
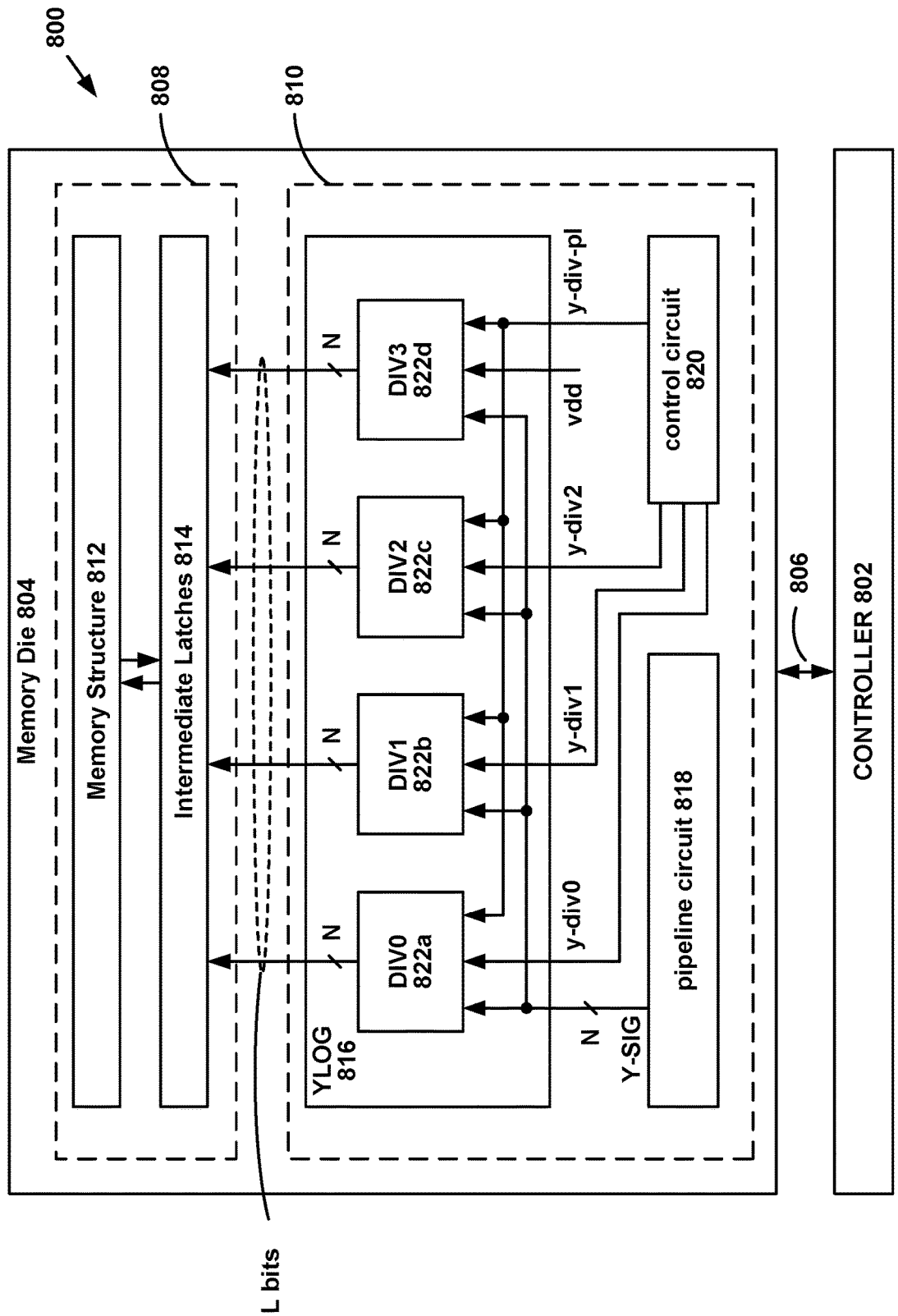
FIG. 8C is a diagram depicting a more detailed embodiment of the integrated memory assembly of FIG. 8A.

FIG. 8C is a diagram depicting a more detailed embodiment of integrated memory assembly 800 of FIG. 8A. In particular, peripheral region 810 includes a YLOG circuit 816, a pipeline circuit 818 and a control circuit 820. Peripheral region 810 may include circuits other than or in addition to those shown in FIG. 8C.

In an embodiment, memory structure 812 is organized into multiple divisions, and each division is organized into multiple subdivisions. In an embodiment, memory structure 812 is organized into M divisions, and each division is organized into K subdivisions, where M and K are integer values (e.g., M=4 and K=5, or other values). YLOG circuit 816 includes M latch circuits 822, one per division. For example, with M=4, YLOG circuit 816 includes four latch circuits 822a-822d. More or fewer than four latch circuits 822 may be used. For simplicity, the remaining discussion will assume that memory structure 812 is organized into four divisions, and each division is organized into five subdivisions In an embodiment, during a data-in operation, pipeline circuit 818 receives 8-bit parallel data and a corresponding clock signal via communication channel 806 from controller 802 and implements a serial-in parallel-out operation to provide N-bit parallel data signal Y-SIG to YLOG circuit 816, where N is an integer value (e.g., N=32 or some other value). In addition, control circuit 820 provides control signals y-div0, y-div1, y-div2 and y div-p1 to YLOG circuit 816. YLOG circuit 816 receives the N-bit parallel data signal Y-SIG and control signals y-div0, y-div1, y-div2 and y-div-p1, and accumulates the data to provide N×M=L-bit parallel data to intermediate latches 814 of memory core 808. Although not depicted in FIG. 8C, YLOG circuit 816 also provides control signals with the L-bit data chunks for storing the data in intermediate latches 814.

Figure 8D:
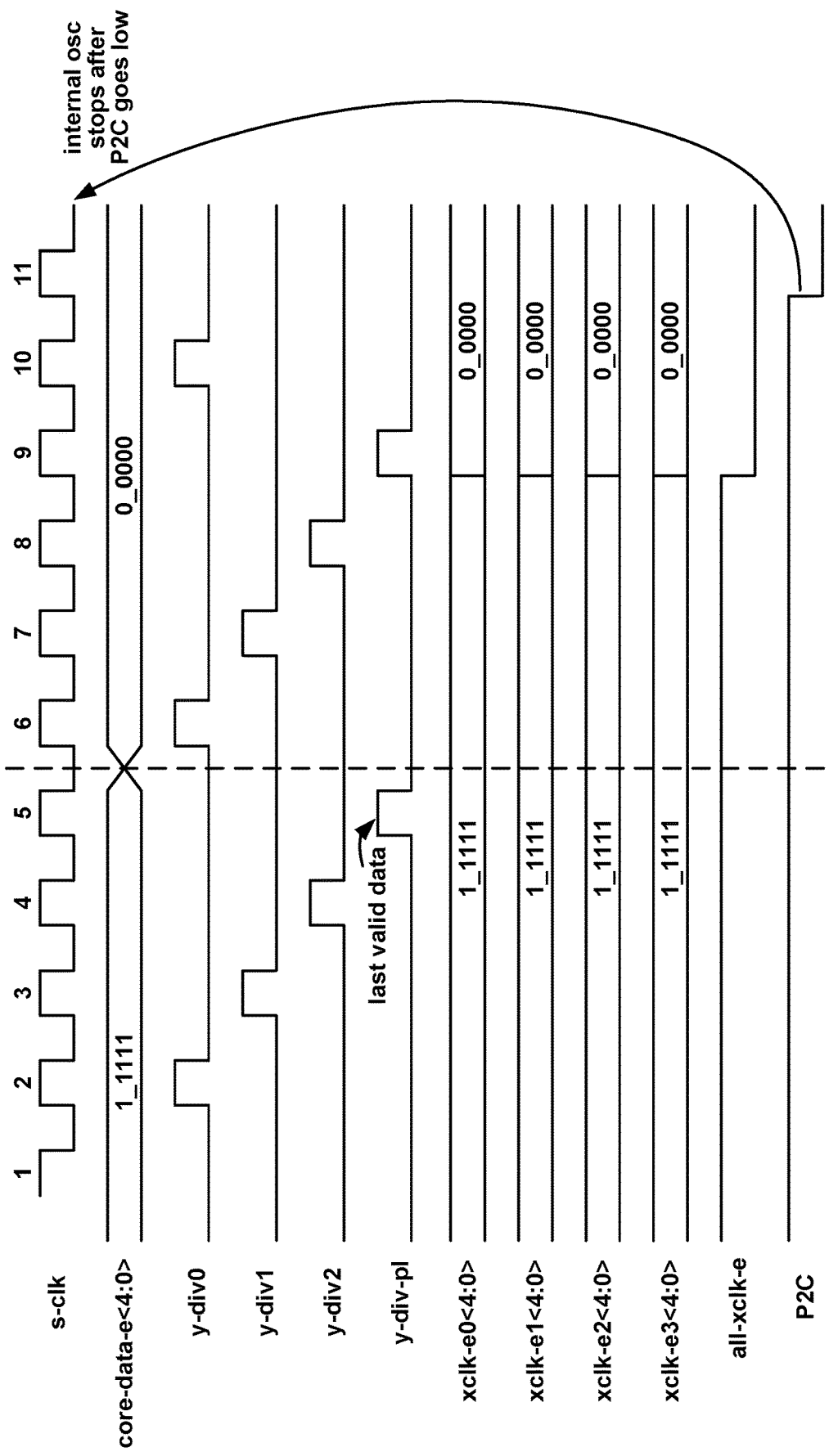
FIG. 8D depicts an example timing diagram of a clock signal and various control signals used by the integrated memory assembly of FIG. 8A.

FIG. 8D depicts an example timing diagram of a clock signal s-clk, and control signals core-data-e, ydiv-0, ydiv-1, ydiv-2, y-div-p1, ycom-clk, xclk-e0, xclk-e1, xclk-e2, xclk-e3, all-xclk-e and P2C used by integrated memory assembly 800. Peripheral region 810 uses clock signal s-clk to accumulate data received from controller 802 to create L-bit chunks of data that are pushed to intermediate latches 814. Control circuit 820 uses clock signal s-clk to generate control signals y-div0, y-div1, y-div2 and y-div-p1. Clock signal s-clk includes clock cycles provided by controller 802, and additional clock cycles provided by the internal oscillator of peripheral region 810 (FIG. 8A) that are needed to push the data to intermediate latches 814.

In an embodiment, core-data-e is a K-bit signal that includes one bit per subdivision. For example, with K=5, core-data-e is a 5-bit signal. In an embodiment, while controller 802 sends data to be written to memory die 804, all five bits of core-data-e are "1," (i.e., "11111"). When controller 802 completes sending data to be written to memory die 804, all five bits of core-data-e change from "1" to "0." (i.e., core-data-e changes from "11111" to "00000"). In the example illustrated in FIG. 8D, core-data-e changes from "11111" to "00000" on s-clk cycle 5. Depending on the amount of data being written, controller 802 may complete sending data to be written to memory die 804 on other clock cycles of s-clk, and core-data-e may change from "11111" to "00000" on other clock cycles of s-clk (e.g., on s-clk cycle 1, 2, 3, . . . ).

As described above, along with the data to be written to memory die 804, controller 802 also sends a corresponding clock signal that includes a predetermined number of clock cycles per word (e.g., one clock cycle per word) to memory die 804. Because of latency through pipeline circuit 818 and YLOG circuit 816, however, the number of clock cycles provided by controller 802 is not sufficient to push the data through pipeline circuit 818 and YLOG circuit 816 to intermediate latches 814. So the internal oscillator of peripheral region 810 generates the extra clock cycles of s-clk needed to push the data through pipeline circuit 818 and YLOG circuit 816 to intermediate latches 814.

Figure 8E:
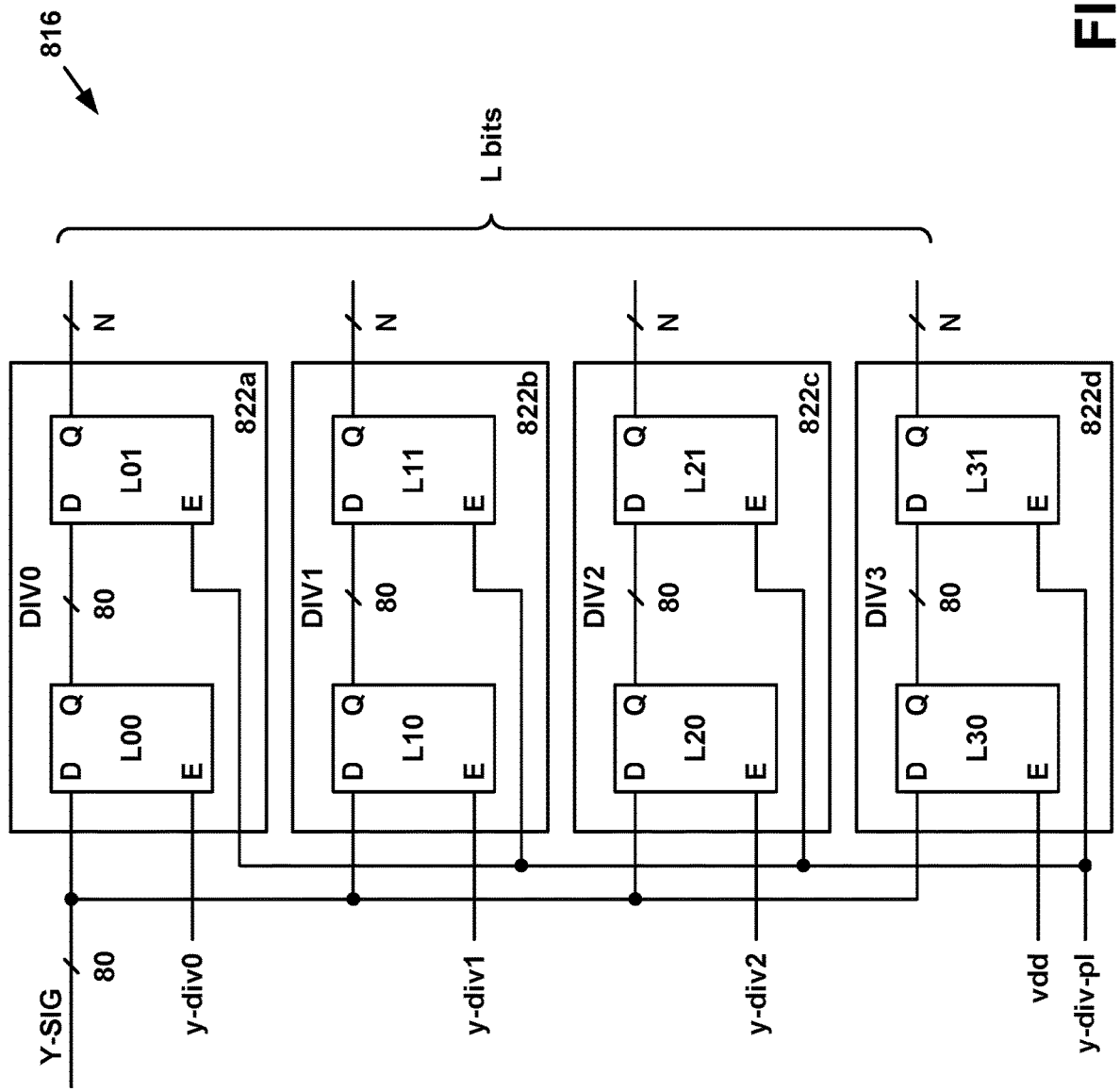
FIG. 8E is a functional block diagram of an embodiment of a YLOG circuit of the integrated memory assembly of FIG. 8A.

FIG. 8E is a functional block diagram of an embodiment of YLOG circuit 816, which includes M=4 latch circuits 822a-822d, one for each division of memory structure 812. Each of latch circuits 822a-822d includes a pair of latches. In particular, latch circuit 822a includes a first latch L00 and a second latch L01, latch circuit 822b includes a first latch L10 and a second latch L11, latch circuit 822c includes a first latch L20 and a second latch L21, and latch circuit 822*d* includes a first latch L30 and a second latch L31.

In an embodiment, each of latches L00-L31 of latch circuits 822*a*-822*d* is a D-latch, although other latches may be used. Latches L00, L10, L20 and L30 each include a data input D coupled to N-bit data signal Y-SIG, and include an N-bit output Q coupled to a data input D of latches L01, L11, L21 and L31, respectively. Latches L00, L10 and L20 each include a control (or enable) input E coupled to control signals y-div0, y-div1 and y-div2, respectively, and latch L30 includes a control (or enable) input E coupled to Vdd. Latches L01, L11, L21 and L31 each include a control (or enable) input E coupled to control signal y-div-p1, and each include an N-bit output Q. Thus, latch circuits 822*a*-822*d* collectively provide L-bit parallel data to intermediate latches 814 of memory core 808.

Referring to FIGS. 8D and 8E, an example operation of YLOG circuit 816 is described. On the falling edges of control signals y-div0, y-div1 and y-div2, Latches L00, L10 and L20, respectively, latch the corresponding N-bit values of input data signal Y-SIG. Latch L30 is always enabled, so the output Q of Latch 30 follows the N-bit input data signal Y-SIG. On the falling edge of control signal y-div-p1, Latches L01, L11, L21 and L31 latch the corresponding values of the N-bit outputs Q of Latches L00, L10, L20 and L30, respectively. Thus, on each cycle of signal y-div-p1, YLOG circuit 816 provides L-bit data to intermediate latches 814.

In the example timing diagram of FIG. 8D, the control signal y-div-p1 that is synched to the s-clk cycle 5 is labeled "last valid data." This is because in this example, core-data-e changes from "11111" to "00000" on s-clk cycle 5, indicating the controller 802 has completed sending data to be written to memory die 804. Thus, the L-bit data latched by YLOG circuit 816 on s-clk cycle 5 is the last valid L-bit block of data provided to intermediate latches 814. The remaining cycles of control signals y-div0, y-div1, y-div2 and y-div-p1 (corresponding to s-clk cycles 6-10) are used to push remaining data through YLOG circuit 816 to intermediate latches 814.

In the embodiment depicted in FIG. 8D, control signals all-xclk-e and P2C are used to determine when the internal oscillator of peripheral region 810 stops providing the additional s-clk cycles, and hence to determine the end of the data-in operation. As described above, memory die 804 sets P2C HIGH during a data-in cycle, and LOW otherwise. In an embodiment, P2C changing from HIGH to LOW halts the internal oscillator of peripheral region 810, ending the data-in operation.

In an embodiment, control signal P2C goes from HIGH to LOW two clock cycles after control signal all-xclk-e goes from HIGH to LOW. In the example depicted in FIG. 8D, control signal all-xclk-e goes from HIGH to LOW on the rising edge of s-clk cycle 9, and thus control signal P2C changes from HIGH to LOW on the rising edge of s-clk cycle 11. Therefore, s-clk cycle 11 is the final s-clk cycle provided by the internal oscillator of peripheral region 810 for this data-in operation.

Figure 8F:
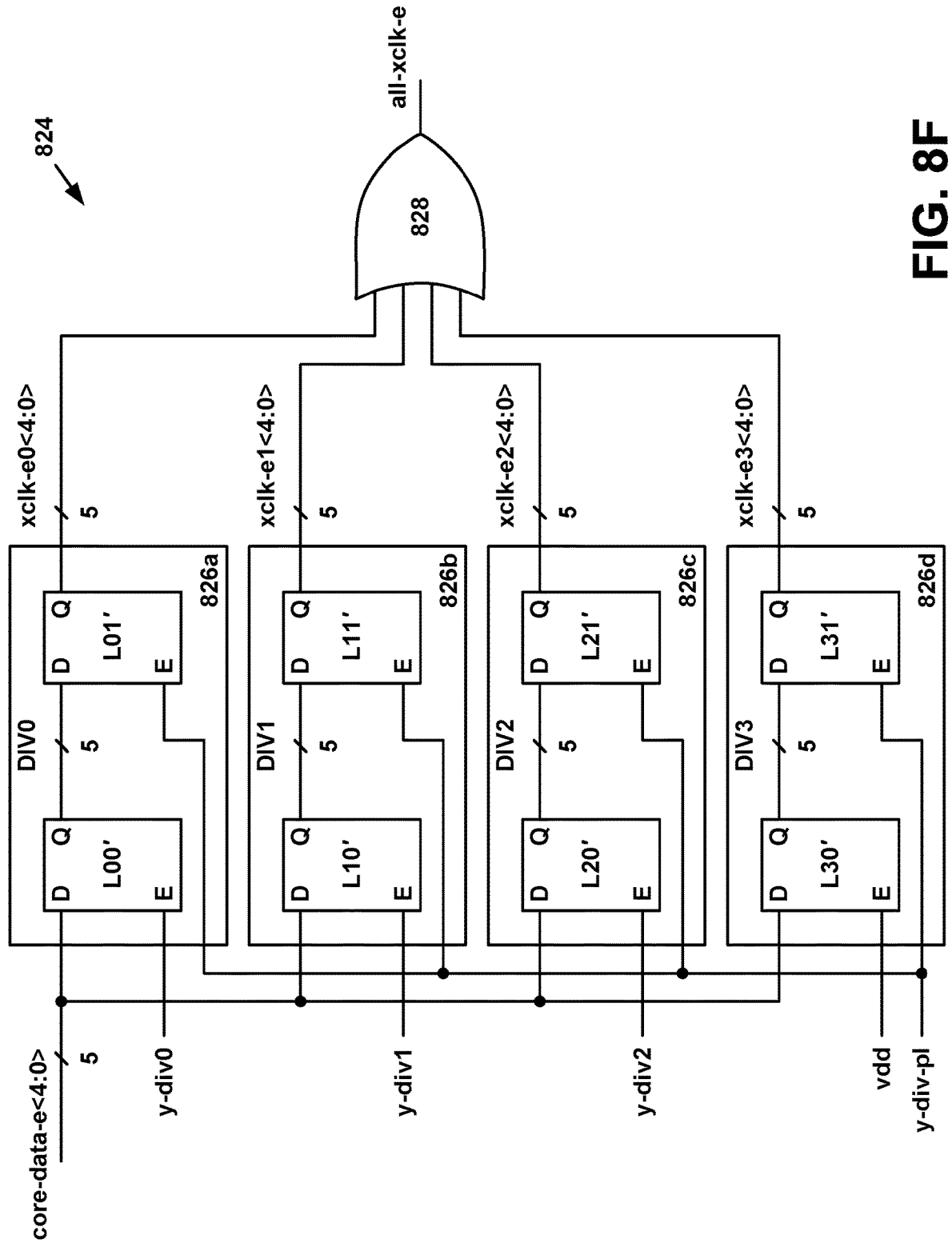
FIG. 8F is a functional block diagram of an embodiment of a control signal circuit of the integrated memory assembly of FIG. 8A.

FIG. 8F is a functional block diagram of an embodiment of control signal circuit 824 which receives control signals core-data-e, y-div0, y-div1, y-div2 and ydiv-p1, and generates control signals xclk-e0, xclk-e1, xclk-e2, xclk-e3 and all-xclk-e. In an embodiment, control circuit 820 (FIG. 8C) includes control signal circuit 824. Control signal circuit 824 includes M=4 latch circuits 826*a*-826*d*, one for each division of memory structure 812, and an OR-gate 828. Each of latch circuits 826*a*-826*d* includes a pair of latches. In particular, latch circuit 826*a* includes a first latch L00' and a second latch L01', latch circuit 826*b* includes a first latch L10' and a second latch L11', latch circuit 826*c* includes a first latch L20' and a second latch L21', and latch circuit 826*d* includes a first latch L30' and a second latch L31'.

In an embodiment, each of latches L00'-L31' is a D-latch, although other latches may be used. Latches L00', L10', L20' and L30' each include a data input D coupled to 5-bit control signal core-data-e, and each include a 5-bit output Q coupled to a data input D of latches L01', L11', L21' and L31', respectively. Latches L00', L10' and L20' each include a control (or enable) input E coupled to control signals y-div0, y-div1 and y-div2, respectively, and latch L30' includes a control (or enable) input E coupled to Vdd. Latches L01', L11', L21' and L31' each include a control (or enable) input E coupled to control signal y-div-p1, and include a 5-bit output Q, control signals xclk-e0, xclk-e1, xclk-e2 and xclk-e3, respectively. Control signals xclk-e0, xclk-e1, xclk-e2 and xclk-e3 are coupled to inputs of an OR-gate 828, which provides a single-bit output control signal all-xclk-e.

Referring to FIGS. 8D and 8F, an example operation of control signal circuit 824 is described. On the falling edges of control signals y-div0, y-div1 and y-div2, Latches L00', L10' and L20', respectively, latch the corresponding 5-bit values of core-data-e. Latch L30' is always enabled, so the output Q of Latch 30 follows the 5-bit values of core-data-e. On the falling edge of control signal y-div-p1, Latches L01', L11', L21' and L31' latch the corresponding values of the 5-bit outputs Q of Latches L00', L10', L20' and L30', respectively. Thus, on each cycle of control signal y-div-p1, control signal circuit 824 provides 5-bit data to OR-gate 828, which provides a single-bit output control signal all-xclk-e.

As described above, while controller 802 sends data to be written to memory die 804, core-data-e is "11111", and when controller 802 completes sending data to be written to memory die 804, core-data-e changes from "11111" to "00000". Thus, while controller 802 sends data to be written to memory die 804, control signals xclk-e0, xclk-e1, xclk-e2 and xclk-e3 are all "11111", and all-xclk-e is 1. In the example depicted in FIG. 8D, after s-clk cycle 5, core-data-e changes from "11111" to "00000". Thus, as depicted in FIG. 8D, on the first rising edge of control signal y-div-p1, control signals xclk-e0, xclk-e1, xclk-e2 and xclk-e3 all change from "11111" to "00000", and control signal all-xclk-e changes from HIGH to LOW. In the example depicted in FIG. 8D, this occurs on the rising edge of s-clk cycle 9.

As described above, in an embodiment control signal P2C changes from HIGH to LOW two clock cycles after control signal all-xclk-e changes from HIGH to LOW. Thus, because control signal all-xclk-e changes from HIGH to LOW on the rising edge of s-clk cycle 9, control signal P2C goes from HIGH to LOW on the rising edge of s-clk cycle 11, and therefore s-clk cycle 11 is the final s-clk cycle provided by the internal oscillator of peripheral region 810 for this data-in operation.

In the example operation of integrated memory assembly 800 described above, the change of state of control signal all-xclk-e from HIGH to LOW is based on detecting data unavailability in all subdivisions. In particular, control signal all-xclk-e changes from HIGH to LOW only after control signals xclk-e0, xclk-e1, xclk-e2 and xclk-e3 all change from "11111" to "00000". As described above, after an additional two s-clk cycles, control signal P2C changes from HIGH to LOW, and then the internal oscillator of peripheral region 810 stops providing the additional s-clk cycles. Although this technique achieves the goal of pushing data through pipeline circuit 818 and YLOG circuit 816, the technique requires six additional s-clk cycles after core-data-e changes from "11111" to "00000" before data-in ends.

As can be seen in FIG. 8D, after the last valid data in s-clk cycle 5, any remaining data that had been in pipeline circuit 818 is pushed to intermediate latches 814 on the next cycle of control signal y-div-p1 (e.g., at s-clk cycle 9). Thus, changing the state of all-xclk-e from HIGH to LOW based on detecting data unavailability in all subdivisions requires three additional clock cycles (s-clk cycles 9-11), which prolongs controller 802 idle time tcwaw. For example, if each clock cycle has a period of 8 nsec, three extra clock cycles is equivalent to increasing controller 802 idle time by 24 nsec.

Technology is described for reducing controller 802 idle time tcwaw by predicting (rather than detecting) data unavailability in all subdivisions, and then ending the data-in operation based on the prediction. Without wanting to be bound by any particular theory, it is believed that ending the data-in operation based on predicting (rather than detecting) data unavailability in all subdivisions may reduce the number of clock cycles required to complete a data-in operation, and thus reduce controller 802 idle time.

Figure 9A:
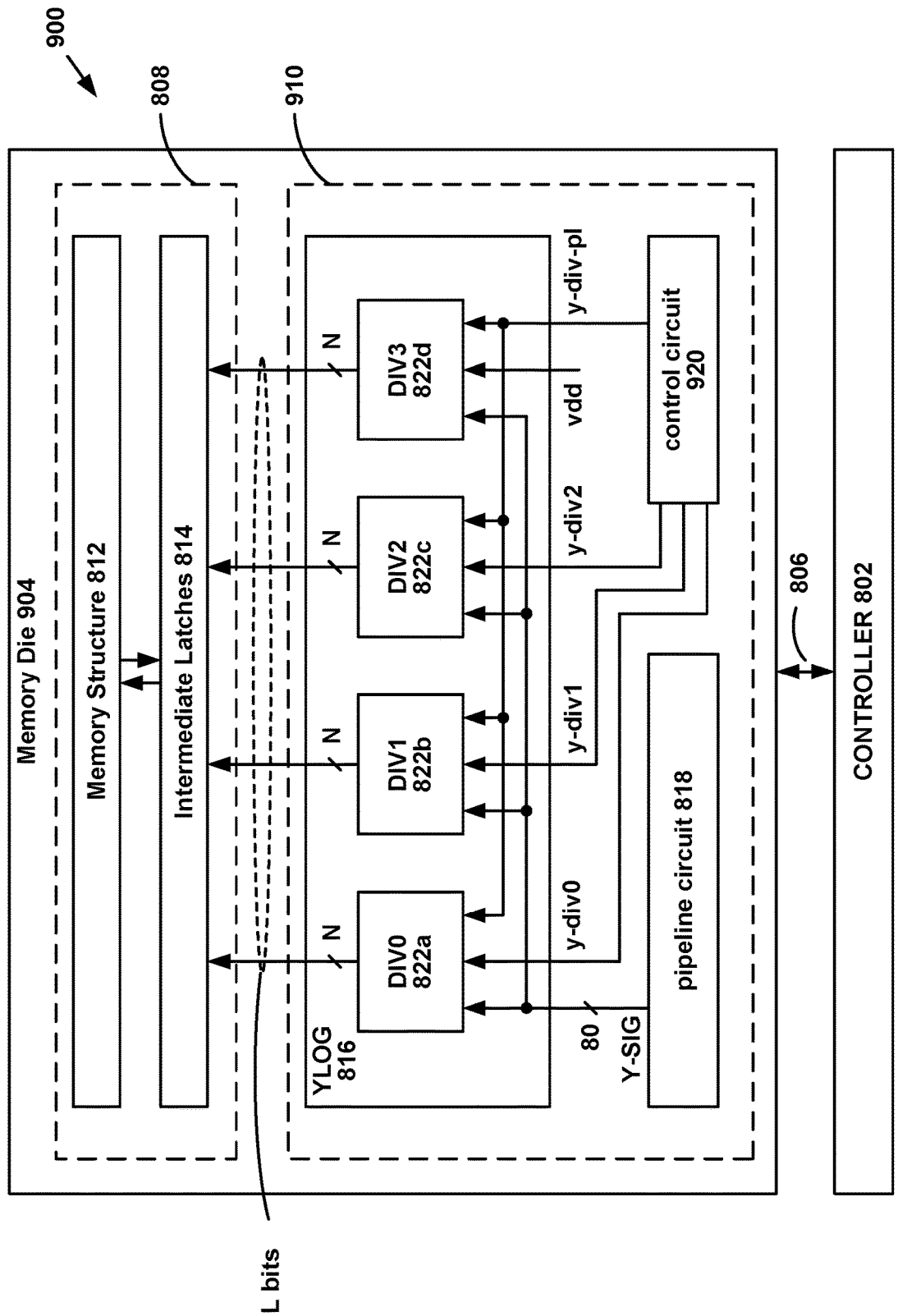
FIG. 9A is a diagram depicting an integrated memory assembly 900.

FIG. 9A is a diagram depicting an integrated memory assembly 900 that implements that described technology. Integrated memory assembly 900 is similar to integrated memory assembly 800 of FIG. 8C. In particular, integrated memory assembly 900 includes controller 802 and a memory die 904.

Integrated memory assembly 900 is an embodiment of integrated memory assembly 200 of FIG. 2A, and memory die 904 is an embodiment of memory die 204 of FIG. 2A. Although a single memory die 904 is shown in FIG. 9A, integrated memory assembly 900 may include multiple memory die 904. In addition, integrated memory assembly 900 may include circuits other than or in addition to those shown in FIG. 9A.

In an embodiment, controller 802 and memory die 904 are on two separate integrated circuit devices, such as described above in connection with FIGS. 2A-2B. In other embodiments, controller 802 and memory die 904 are on a single integrated circuit device. In an embodiment, controller 802 and memory die 904 communicate commands, data, control signals, clock signals and other signals over communication channel 806, which may be a Toggle Mode Interface or other interface.

Memory die 904 includes memory core 808 and a peripheral region 910. In an embodiment, peripheral region 910 includes YLOG circuit 816, pipeline circuit 818 and a control circuit 920. Peripheral region 910 may include circuits other than or in addition to those shown in FIG. 9A.

In an embodiment, during a data-in operation, pipeline circuit 818 receives 8-bit parallel data and a corresponding clock signal from controller 802 and implements a serial-in parallel-out operation to provide N-bit parallel data signal Y-SIG to YLOG circuit 816. In addition, control circuit 920 provides control signals y-div0, y-div1, y-div2 and y-div-p1 to YLOG circuit 816. YLOG circuit 816 receives the N-bit parallel data signal Y-SIG and control signals y-div0, y-div1, y-div2 and y-div-p1, and accumulates the data to provide N×M=L-bit data chunks to intermediate latches 814 of memory core 808. Although not depicted in FIG. 9A, YLOG circuit 816 also provides control signals with the L-bit data chunks for storing the data in intermediate latches 814.

Figure 9B:
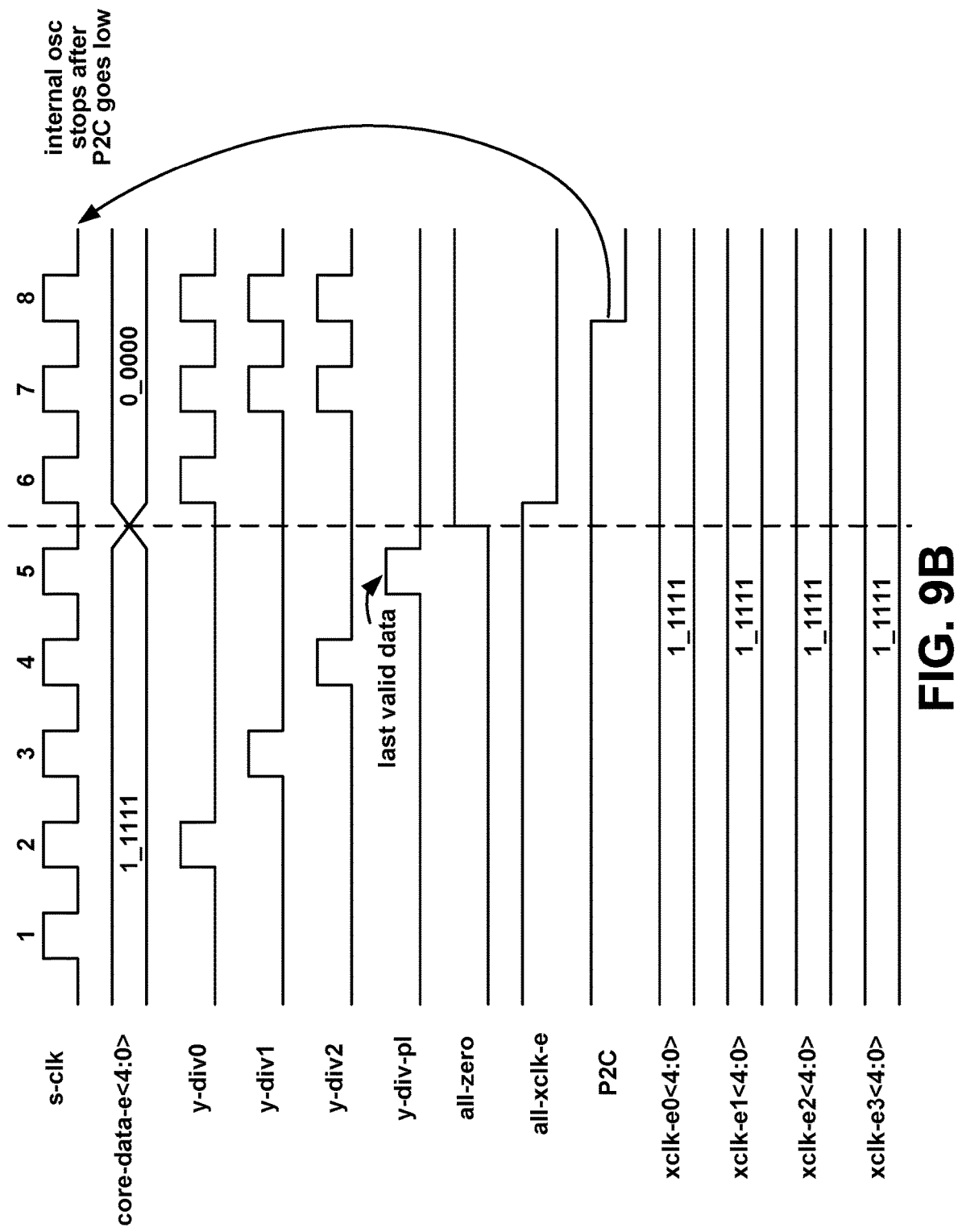
FIG. 9B depicts an example timing diagram of a clock signal and various control signals used by the integrated memory assembly of FIG. 9A.

FIG. 9B depicts an example timing diagram of clock signal s-clk, and control signals core-data-e, ydiv-0, ydiv-1, ydiv-2, y-div-p1, all-zero, all-xclk-e, P2C, xclk-e0, xclk-e1, xclk-e2 and xclk-e3, used by integrated memory assembly 900. Clock signal s-clk is used by peripheral region 910 to accumulate the data received from controller 802 to create L-bit chunks of data that are pushed to intermediate latches 814. Clock signal s-clk includes clock cycles provided by controller 802 and additional clock cycles provided by an internal oscillator (not shown) of peripheral region 910 that are needed to push the data to intermediate latches 814.

Figure 9C:
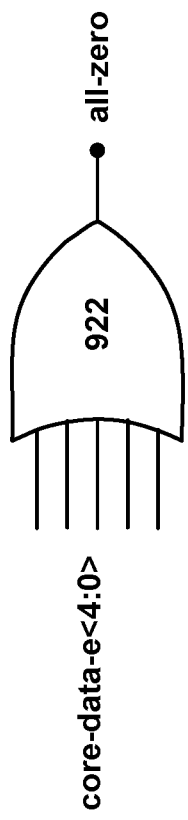
FIGS. 9C-9E are functional block diagrams of embodiments of control signal circuits of the integrated memory assembly of FIG. 9A.

The control signals depicted in FIG. 9B are similar to the control signals depicted in FIG. 8D, but also include control signal all-zero. In an embodiment, control circuit 920 includes circuitry for generating control signal all-zero. FIG. 9C depicts an embodiment of a control signal circuit (NOR circuit) 922 that receives 5-bit control signal core-data-e, and generates control signal all-zero. In an embodiment, control circuit 920 includes NOR circuit 922.

As depicted in FIG. 9B, control signal all-zero is LOW when any bit of core-data-e is 1, and changes from LOW to HIGH when all K=5 bits of core-data-e are 0. In the depicted example, control signal all-zero changes from LOW to HIGH when core-data-e changes from "11111" to "00000" on s-clk cycle 5. In this regard, control signal all-zero changes from LOW to HIGH when controller 802 completes sending data to be written to memory die 904. In this regard, control signal circuit (NOR circuit) 922 may be used to determine or detect that controller 802 has completed sending data to be written to memory die 904.

Figure 9D:
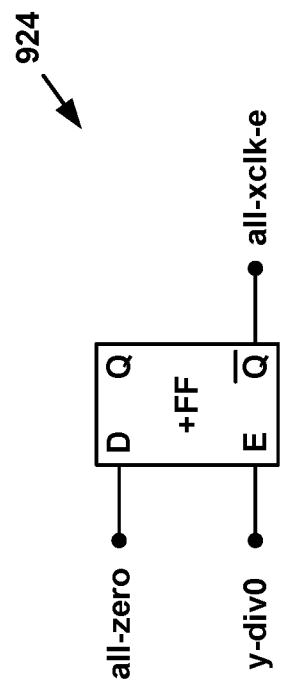

FIG. 9D depicts an embodiment of a control signal circuit 924 that generates control signal all-xclk-e. In an embodiment, control circuit 920 includes control signal circuit 924. In the illustrated embodiment, control signal circuit 924 includes a positive edge-triggered flip-flop having a data input D coupled to control signal all-zero, a control (or enable) input E coupled to control signal y-div0, and a complementary output $\overline{Q}$ providing control signal all-xclk-e. When control signal all-zero is LOW, complementary output $\overline{Q}$ is HIGH. On the positive edge of control signal y-div0, complementary output $\overline{Q}$ switches from HIGH to LOW, and thus control signal all-xclk-e switches from HIGH to LOW.

Referring again to FIG. 9B, control signals all-xclk-e and P2C are used to determine when the internal oscillator of peripheral region 910 stops providing the additional s-clk cycles, and hence determine the end of the data-in operation. As described above, memory die 804 sets P2C HIGH during a data-in cycle, and LOW otherwise. In an embodiment, control signal P2C changes from HIGH to LOW two clock cycles after control signal all-xclk-e changes from HIGH to LOW. In an embodiment, P2C changing from HIGH to LOW halts the internal oscillator of peripheral region 910, ending the data-in operation.

Figure 9E:
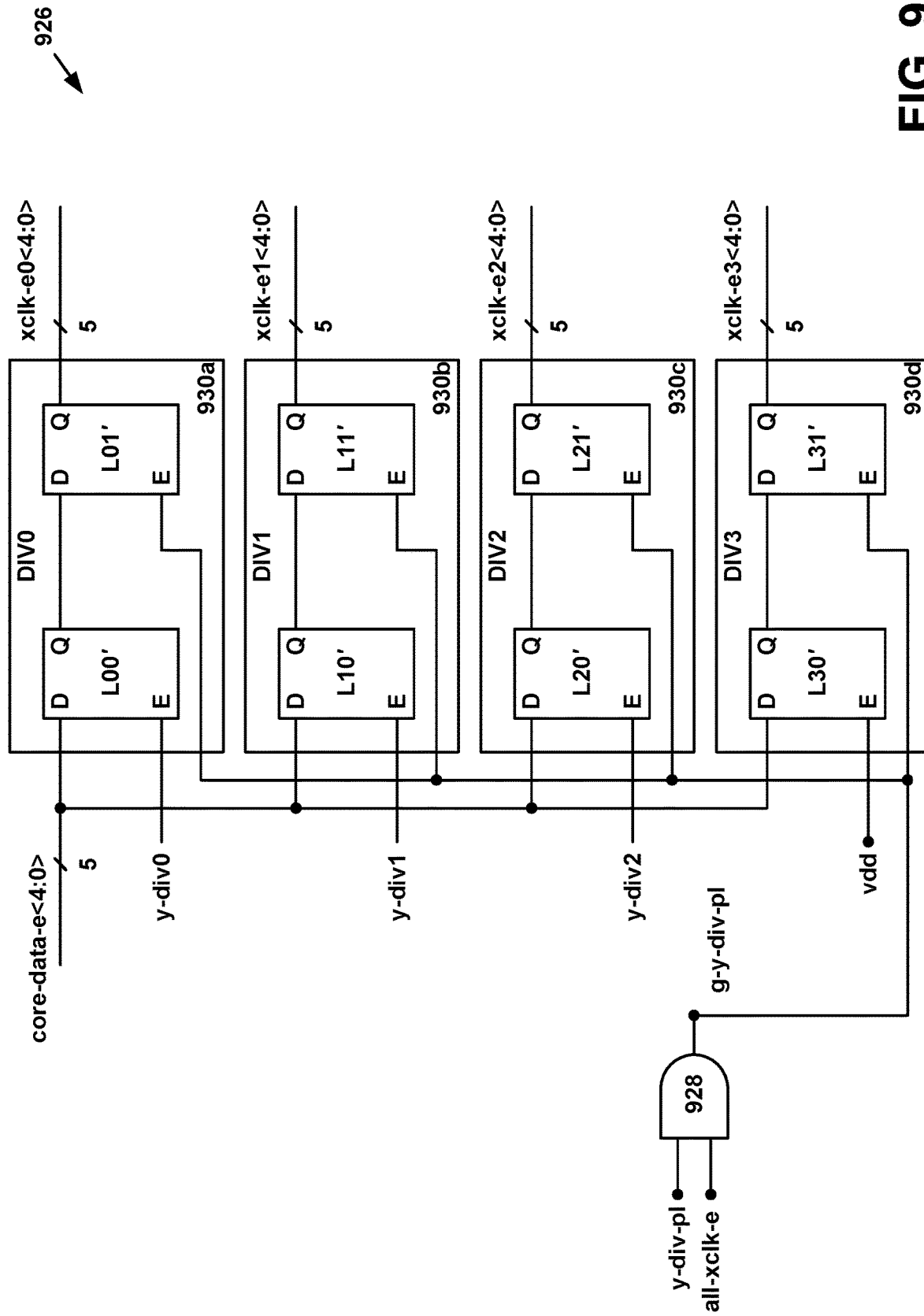

FIG. 9E is a functional block diagram of an embodiment of control signal circuit 926 which receives control signals core-data-e, y-div0, y-div1, y-div2 and ydiv-p1, and all-xclk-e, and generates control signals xclk-e0, xclk-e1, xclk-e2, and xclk-e3. In an embodiment, control signal circuit 926 is included in control circuit 920 (FIG. 9A).

Control signal circuit 926 includes AND gate 928 and M=4 latch circuits 930a-930d, one for each division of memory structure 812. Each of latch circuits 930a-930d includes a pair of latches. In particular, latch circuit 930a includes first latch L00' and second latch L01', latch circuit 930b includes first latch L10' and second latch L11', latch circuit 930c includes first latch L20' and second latch L21', and latch circuit 930d includes first latch L30' and second latch L31'.

In an embodiment, each of latches L00'-L31' is a D-latch, although other latches may be used. Latches L00', L10', L20' and L30' each include a data input D coupled to 5-bit control signal core-data-e, and include an 5-bit output Q coupled to a data input D of latches L01', L11', L21' and L31', respectively. Latches L00', L10' and L20' each include a control (or enable) input E coupled to control signals y-div0, y-div1 and y-div2, respectively, and latch L30' includes a control (or enable) input E coupled to Vdd. Latches L01', L11', L21' and L31' each include a control (or enable) input E coupled to control signal g-y-div-p1, and each include a 5-bit output Q, control signals xclk-e0, xclk-e1, xclk-e2 and xclk-e3, respectively. Control signals y-div-p1 and all-xclk-e are coupled to inputs of an AND-gate 928, which provides output control signal g-y-div-p1.

Referring to FIGS. 9B and 9E, control signals y-div-p1 and all-xclk-e are both HIGH during the first half of s-clk cycle 5. Control signal g-y-div-p1 will go LOW on the falling edge of y-div-p1, and remains LOW while core-data-e changes from "11111" to "00000". As a result, control signals xclk-e0, xclk-e1, xclk-e2 and xclk-e3 each remain "11111" even after core-data-e changes from "11111" to "00000".

Referring again to FIG. 9B, control signal all-xclk-e changes from HIGH to LOW on the first rising edge of control signal y-div0 after control signal all-zero changes from LOW to HIGH. In the embodiment depicted in FIG. 9B, control signal all-xclk-e changes from HIGH to LOW on the rising edge of s-clk cycle 6, and thus control signal P2C changes from HIGH to LOW on the rising edge of s-clk cycle 8. Therefore, s-clk cycle 8 is the final s-clk cycle provided by the internal oscillator of peripheral region 910 for this data-in operation.

Thus, in contrast to the example operation of integrated memory assembly 800 in which s-clk cycle 11 is the final s-clk cycle provided by the internal oscillator of peripheral region 810, in the example operation of integrated memory assembly 900, s-clk cycle 8 is the final s-clk cycle provided by the internal oscillator of peripheral region 910, saving three clock cycles of s-clk.

In the example operation of integrated memory assembly 900, peripheral region 910 ends execution of the data-in command without determining that pipeline circuit 818 has completed processing the data. In addition, in the example operation of integrated memory assembly 900, peripheral region 910 predicts that pipeline circuit 818 has completed processing the received data from controller 802, and ends execution of the data-in command based on the prediction.

As described above, in the example operation of integrated memory assembly 800, the change of state of control signal all-xclk-e from HIGH to LOW is based on detecting data unavailability in all subdivisions (by waiting until control signals xclk-e0, xclk-e1, xclk-e2 and xclk-e3 all change from "11111" to "00000"), and then data-in ends when control signal P2C goes from HIGH to LOW.

In contrast, in the example operation of integrated memory assembly 900, the change of state of control signal all-xclk-e from HIGH to LOW is based on predicting data unavailability in all subdivisions, which permits a savings of three clock cycles. If each clock cycle has a period of 8 nsec, saving three extra clock cycles amounts to saving 24 nsec.

One embodiment includes and apparatus that includes a memory die including a pipeline circuit coupled to a memory structure. The memory die is configured to execute a first command by receiving in the pipeline circuit data to be written to the memory structure, processing the received data in the pipeline circuit and providing the processed data to the memory structure, predicting that the pipeline circuit has completed processing the received data, and ending execution of the first command based on the prediction.

One embodiment includes a method that includes receiving a first command at a memory die that includes a pipeline circuit coupled to a memory structure, processing data associated with the first command in the pipeline circuit and providing the processed data for writing to the memory structure, and ending execution of the first command without determining that the pipeline circuit has completed processing the data.

One embodiment includes a system that includes a first semiconductor die including a controller, a second semiconductor die bonded to the first semiconductor die, the second semiconductor die including a memory die including a peripheral region and a memory core that includes non-volatile memory cells. The peripheral region includes circuitry configured to receive a first command and data associated with the first command sent from the controller, execute the first command by accumulating chunks of the received data to be written to the non-volatile memory cells, detect that the controller has stopped sending data to the memory die, and end execution of the first command based on the detection without determining that the circuitry has completed accumulating the data.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
a memory die comprising a pipeline circuit coupled to a memory structure, the memory die configured to:
execute a first command by:
receiving in the pipeline circuit data to be written to the memory structure;

processing the received data in the pipeline circuit and providing the processed data to the memory structure;
predicting that the pipeline circuit has completed processing the received data; and
ending execution of the first command based on the prediction.

2. The apparatus of claim 1, wherein the memory die is further configured to wait until the memory die ends executing the first command before starting to execute a second command.

3. The apparatus of claim 2, wherein the first command comprises a data-in command, and the second command comprises any of a data-in command, a data-out command, a dummy command, and an erase command.

4. The apparatus of claim 1, wherein the predicting further comprises determining that a source of the received data has completed sending data to be written to the memory die.

5. The apparatus of claim 1, wherein the memory die comprises a peripheral region that includes the pipeline circuit and a memory core that includes the memory structure.

6. The apparatus of claim 1, wherein the pipeline circuit is configured to accumulate the received data, and provide the accumulated data for programming on the memory structure.

7. The apparatus of claim 1, wherein the memory die further comprises intermediate latches coupled to the pipeline circuit and the memory structure, and wherein executing the first command comprises storing the processed data in the intermediate latches, and programming the memory structure based on the stored data.

8. The apparatus of claim 1, further comprising a controller configured to provide the pipeline circuit with the data to be written.

9. The apparatus of claim 1, further comprising a first semiconductor die that includes the memory die, and a second semiconductor die that comprises a controller configured to provide the data to be written to the pipeline circuit.

10. The apparatus of claim 9, wherein the first semiconductor die is directly bonded to the second semiconductor die.

11. A method comprising:
receiving a first command at a memory die that comprises a pipeline circuit coupled to a memory structure;
processing data associated with the first command in the pipeline circuit and providing the processed data for writing to the memory structure; and
ending execution of the first command without determining that the pipeline circuit has completed processing the data.

12. The method of claim 11, further comprising receiving a second command at the memory die before the pipeline circuit has completed processing the data.

13. The method of claim 11, further comprising waiting to end execution of the first command before starting to execute a second command received at the memory die.

14. The method of claim 13, wherein the first command comprises a data-in command, and the second command comprises any of a data-in command, a data-out command, a dummy command, and an erase command.

15. The method of claim 11, further comprising ending execution of the first command after determining that a source of the data has completed sending data to be written to the memory die.

16. The method of claim 11, further comprising accumulating the data in the pipeline circuit, and providing the accumulated data for programming on the memory structure.

17. The method of claim 11, further comprising:
storing the processed data in intermediate latches coupled to the pipeline circuit and the memory structure; and
programming the memory structure based on the stored data.

18. The method of claim 11, wherein the memory die comprises a first semiconductor die directly bonded to a second semiconductor die that is configured to provide the first command and the data.

19. A system comprising:
a first semiconductor die comprising a controller;
a second semiconductor die bonded to the first semiconductor die, the second semiconductor die comprising a memory die comprising a peripheral region and a memory core that includes non-volatile memory cells, the peripheral region comprising circuitry configured to:
receive a first command and data associated with the first command sent from the controller;
execute the first command by accumulating chunks of the received data to be written to the non-volatile memory cells;
detect that the controller has stopped sending data to the memory die; and
end execution of the first command based on the detection without determining that the circuitry has completed accumulating the data.

20. The system of claim 19, wherein the circuitry is further configured to:
receive a second command from the controller; and
waiting to end execution of the first command before starting to execute the second command.

* * * * *